US008303712B2

(12) United States Patent
Nakashima et al.

(10) Patent No.: US 8,303,712 B2
(45) Date of Patent: Nov. 6, 2012

(54) SUBSTRATE PROCESSING APPARATUS, METHOD FOR MANUFACTURING SEMICONDUCTOR DEVICE, AND PROCESS TUBE

(75) Inventors: Seiyo Nakashima, Toyama (JP); Tomoyuki Yamada, Toyama (JP); Masakazu Shimada, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 0 days.

(21) Appl. No.: 12/363,045

(22) Filed: Jan. 30, 2009

(65) Prior Publication Data

US 2009/0197402 A1 Aug. 6, 2009

(30) Foreign Application Priority Data

Jan. 31, 2008 (JP) ................. 2008-020760

(51) Int. Cl.
  *C23C 16/455* (2006.01)
  *C23C 16/458* (2006.01)
  *C23C 16/46* (2006.01)
  *C23F 1/00* (2006.01)
  *H01L 21/306* (2006.01)
  *C23C 16/06* (2006.01)
  *C23C 16/22* (2006.01)

(52) U.S. Cl. ... 118/715; 118/724; 118/725; 156/345.33; 156/345.37; 156/345.51; 156/345.52

(58) Field of Classification Search ............... 118/715, 118/724, 725; 156/345.37, 345.51, 345.52
See application file for complete search history.

(56) References Cited

U.S. PATENT DOCUMENTS

| 4,533,410 | A | * | 8/1985 | Ogura et al. | 117/99 |
| 4,761,269 | A | * | 8/1988 | Conger et al. | 118/679 |
| 4,807,562 | A | * | 2/1989 | Sandys | 118/725 |
| 4,808,551 | A | * | 2/1989 | Mori et al. | 117/90 |
| 5,116,784 | A | * | 5/1992 | Ushikawa | 438/488 |
| 5,370,738 | A | * | 12/1994 | Watanabe et al. | 118/725 |
| 5,453,124 | A | * | 9/1995 | Moslehi et al. | 118/715 |
| 5,500,256 | A | * | 3/1996 | Watabe | 427/579 |
| 5,749,974 | A | * | 5/1998 | Habuka et al. | 118/725 |
| 5,888,907 | A | * | 3/1999 | Tomoyasu et al. | 438/714 |
| 6,090,211 | A | * | 7/2000 | Kamei et al. | 118/725 |
| 6,190,457 | B1 | * | 2/2001 | Arai et al. | 438/478 |
| 6,254,933 | B1 | * | 7/2001 | Habuka et al. | 427/248.1 |
| 6,291,800 | B1 | * | 9/2001 | Shirakawa et al. | 219/390 |
| 6,302,962 | B1 | * | 10/2001 | Nam et al. | 118/696 |
| 6,331,212 | B1 | * | 12/2001 | Mezey, Sr. | 118/725 |
| 6,380,518 | B2 | * | 4/2002 | Shirakawa et al. | 219/390 |

(Continued)

FOREIGN PATENT DOCUMENTS

JP 63-124518 5/1988

(Continued)

*Primary Examiner* — Rudy Zervigon
(74) *Attorney, Agent, or Firm* — Brundidge & Stanger, P.C.

(57) ABSTRACT

In a substrate processing apparatus, a process vessel is configured to accommodate and process a substrate held at a horizontal position. A gas introduction port is installed at a periphery of a first side of the process vessel and configured to introduce gas into the process vessel from a lateral direction of the substrate. A gas exhaust port is installed at a second side of the process vessel which is opposite to the first side, and is configured to exhaust gas inside the process vessel from a lateral direction of the substrate. A slope part is installed between the gas introduction port and the gas exhaust port inside the process vessel, and is configured to guide a flow path of the gas introduced into the process vessel.

15 Claims, 18 Drawing Sheets

U.S. PATENT DOCUMENTS

| | | | |
|---|---|---|---|
| 6,383,330 B1 * | 5/2002 | Raaijmakers | 156/345.1 |
| 6,464,792 B1 * | 10/2002 | Wengert et al. | 118/715 |
| 6,540,837 B2 * | 4/2003 | Raaijmakers | 118/715 |
| 6,572,705 B1 * | 6/2003 | Suntola et al. | 118/702 |
| 6,608,287 B2 * | 8/2003 | Halpin et al. | 219/390 |
| 6,666,921 B2 * | 12/2003 | Sakai et al. | 118/715 |
| 6,820,570 B2 * | 11/2004 | Kilpela et al. | 118/723 R |
| 7,163,587 B2 * | 1/2007 | Kinnard et al. | 118/724 |
| 7,404,984 B2 * | 7/2008 | Suntola et al. | 427/248.1 |
| 7,537,662 B2 * | 5/2009 | Soininen et al. | 118/715 |
| 7,601,223 B2 * | 10/2009 | Lindfors et al. | 118/715 |
| 7,798,096 B2 * | 9/2010 | Mahajani et al. | 118/723 E |
| 2001/0046768 A1 * | 11/2001 | Mezey, Sr. | 438/680 |
| 2004/0216665 A1 * | 11/2004 | Soininen et al. | 118/715 |

FOREIGN PATENT DOCUMENTS

| | | |
|---|---|---|
| JP | 63-310113 | 12/1988 |
| JP | 02279589 | 11/1990 |
| JP | 3-46234 | 2/1991 |
| JP | 03132014 | 6/1991 |
| JP | 2766280 | 4/1998 |
| JP | 2005-243736 | 9/2005 |
| JP | 2005340834 | 12/2005 |
| WO | 03104525 | 12/2003 |

* cited by examiner

SUBSTRATE PROCESSING APPARATUS, METHOD FOR MANUFACTURING SEMICONDUCTOR DEVICE, AND PROCESS TUBE

CROSS-REFERENCE TO RELATED PATENT APPLICATION

This U.S. non-provisional patent application claims priority under 35 U.S.C. §119 of Japanese Patent Application No. 2008-020760, filed on Jan. 31, 2008, in the Japanese Patent Office, the entire contents of which are hereby incorporated by reference.

BACKGROUND OF THE INVENTION

1. Field of the Invention

The present invention relates to a substrate processing apparatus, a method for manufacturing a semiconductor device, and a process tube.

2. Description of the Prior Art

In the fabrication of semiconductor devices such as Dynamic Random Access Memory (DRAM), substrate processing is performed by supplying gas into a process vessel where substrates are loaded. In such a substrate processing, a substrate holding unit charged with a plurality of substrates horizontally held and vertically arranged in multiple stages is loaded into the process vessel, and gas is supplied from the lower part of the process vessel and exhausted through the upper part of the process vessel. In this way, the gas is supplied to the surface of each substrate (for example, see Patent Document 1).

[Patent Document 1] Japanese Patent Publication No. 2005-243736

However, in the above-mentioned substrate processing, gas is difficult to flow through a central region of each substrate, and gas flow rates are different at the peripheral region and the central region of each substrate so that the substrate processing is not performed uniformly over the surface of the substrate. Furthermore, gas flow rates to substrates are different according to the holding position (height) of the substrate inside the substrate holding unit. Thus, the non-uniform substrate processing among the substrates, so-called loading effect, is performed occasionally.

SUMMARY OF THE INVENTION

To solve the above problems, the present invention provides a substrate processing apparatus capable of facilitating a gas supply to the central region of each substrate and suppressing a loading effect, a method for manufacturing a semiconductor device, and a process tube.

According to an aspect of the present invention, there is provided a substrate processing apparatus, comprising: a process vessel configured to accommodate and process a plurality of substrates stacked vertically, each of the plurality of substrates being held horizontally; a gas introduction port installed in a first manifold of the process vessel and configured to introduce a gas into the process vessel from the lateral side of the substrate; a gas exhaust port installed in a second manifold of the process vessel opposite to the gas introduction port, and configured to exhaust the gas inside the process vessel from the lateral side of the substrate; and a first slope part and a second slope part installed between the first manifold and the second manifold inside the process vessel with the plurality of substrates disposed therebetween, the first slope part sloped in a direction different from that of the gas introduction port and the second slope part sloped in a direction different from that of the gas exhaust port in a manner that a surface of the first slope part and a surface of the second slope part are both perpendicular to a principle surface of any one of the plurality of substrates to define a flow path of the gas in z-shape for guiding the gas to flow parallel to the principle surface of any one of the plurality of substrates.

According to another aspect of the present invention, there is provided a process tube having a cylindrical shape, comprising: a first opening formed at an end portion of the cylindrical shape; a first flange formed at the first opening; and a gas introduction port formed in an adjacent region of the first opening and configured to introduce gas into the process tube, wherein a width of the flange in a region where the gas introduction port is installed is greater than that of the flange opposite to the region where the gas introduction port is formed.

According to another aspect of the present invention, there is provided a method for manufacturing a semiconductor device for processing a substrate by using the substrate processing apparatus, comprising: introducing gas from a lateral side of a substrate; guiding the gas by the slope part and supplying the gas to the substrate; and exhausting the gas from the lateral side of the substrate by the gas exhaust port.

According to another aspect of the present invention, there is provided a method for manufacturing a semiconductor device, comprising: loading a substrate into a process vessel and holding the substrate at a horizontal position; introducing gas inside the process vessel from a lateral side of the substrate due to a gas introduction port installed in an adjacent region of the first side of the process vessel; supplying gas to the substrate by guiding the gas along a slope part installed inside the process vessel between the gas introduction port and a gas exhaust port installed in an adjacent region of the second side of the process vessel which is opposite to the first side; exhausting the gas inside the process vessel from the lateral side of the substrate by the gas exhaust port to thereby process the substrate; and unloading the processed substrate from the process vessel.

DETAILED DESCRIPTION OF THE PREFERRED EMBODIMENTS

As described above, in the conventional substrate processing, the substrate holding unit charged with a plurality of substrates horizontally held and vertically arranged in multiple stages is loaded into the process vessel, and the gas is supplied from the lower part of the process vessel and exhausted through the upper part of the process vessel. In this way, the gas is supplied to the surface of each substrate. However, in the above-mentioned substrate processing, the gas is difficult to flow through the central region of each substrate, and the gas flow rates are different at the peripheral region and the central region of each substrate. Furthermore, the gas flow rates to the substrates are different according to the holding position (height) of the substrate inside the substrate holding unit.

The inventors have devoted themselves to researching methods for facilitating the gas supply to the central region of each substrate and suppressing the loading effect. The inventors finally found out that it was effective to circulate gas from the lateral direction of the substrate (parallel direction to the principal surface of the substrate) inside a process chamber which accommodated the substrates horizontally held. Furthermore, the inventors found out that installation of a slope part to guide gas flow inside the process vessel could sufficiently preheat the gas supplied to the substrate and can improve uniformity over the processed surface of the substrate. The present invention was accomplished based upon those findings obtained by the inventors.

First Embodiment of the Present Invention

A first embodiment of the present invention will be described hereinafter.

(1) Constitution of Substrate Processing Apparatus

Figure 1A:
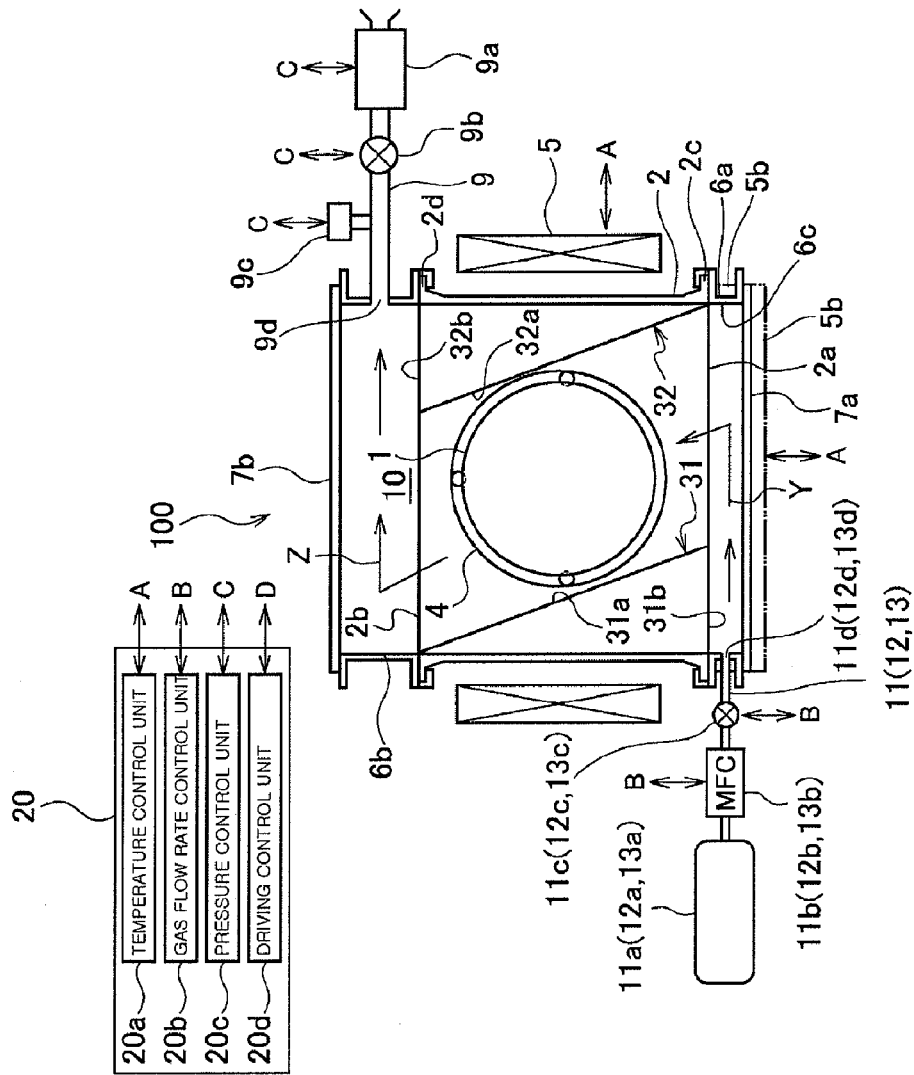
FIG. 1A is a plan cross-sectional view of a substrate processing apparatus relevant to a first embodiment of the present invention.
Figure 1B:
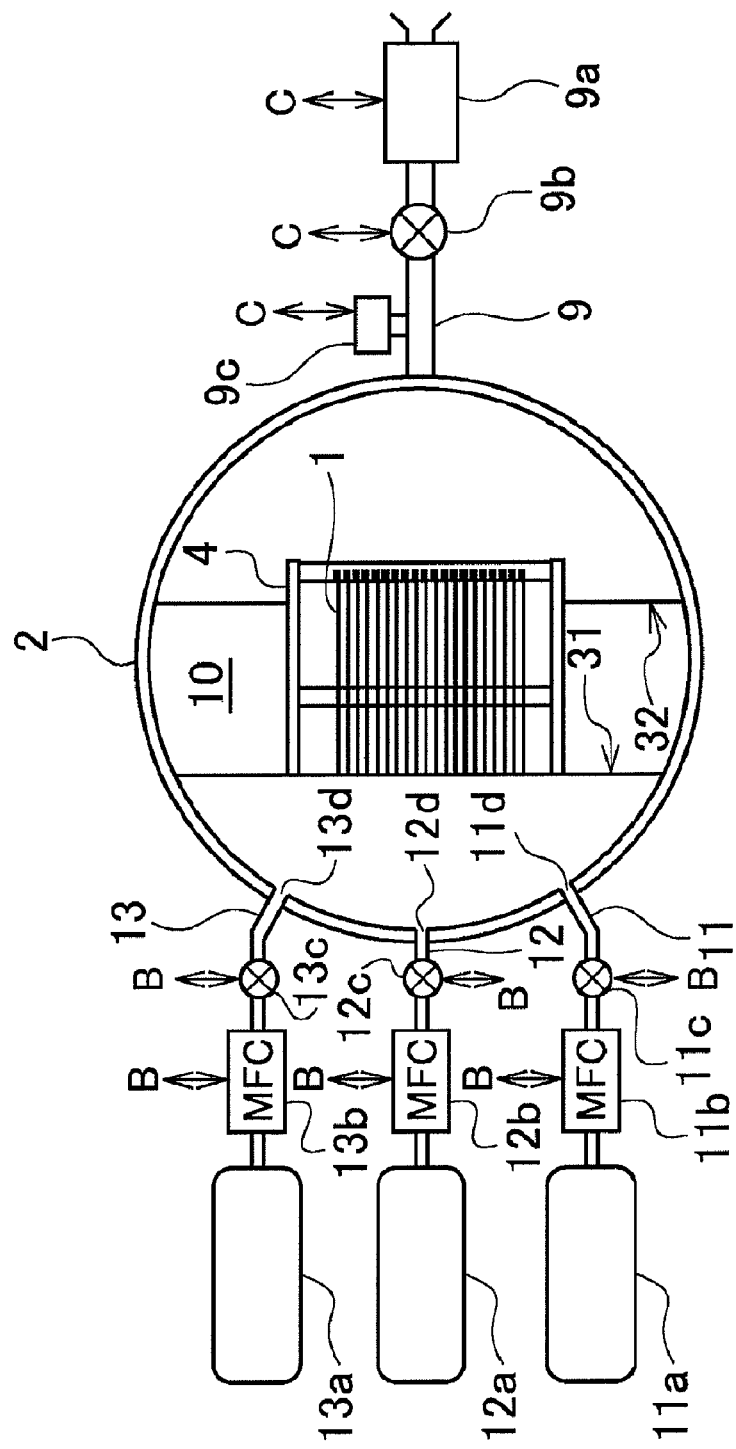
FIG. 1B is a side view taken from the side of a gas introduction port of FIG. 1A.
Figure 2:
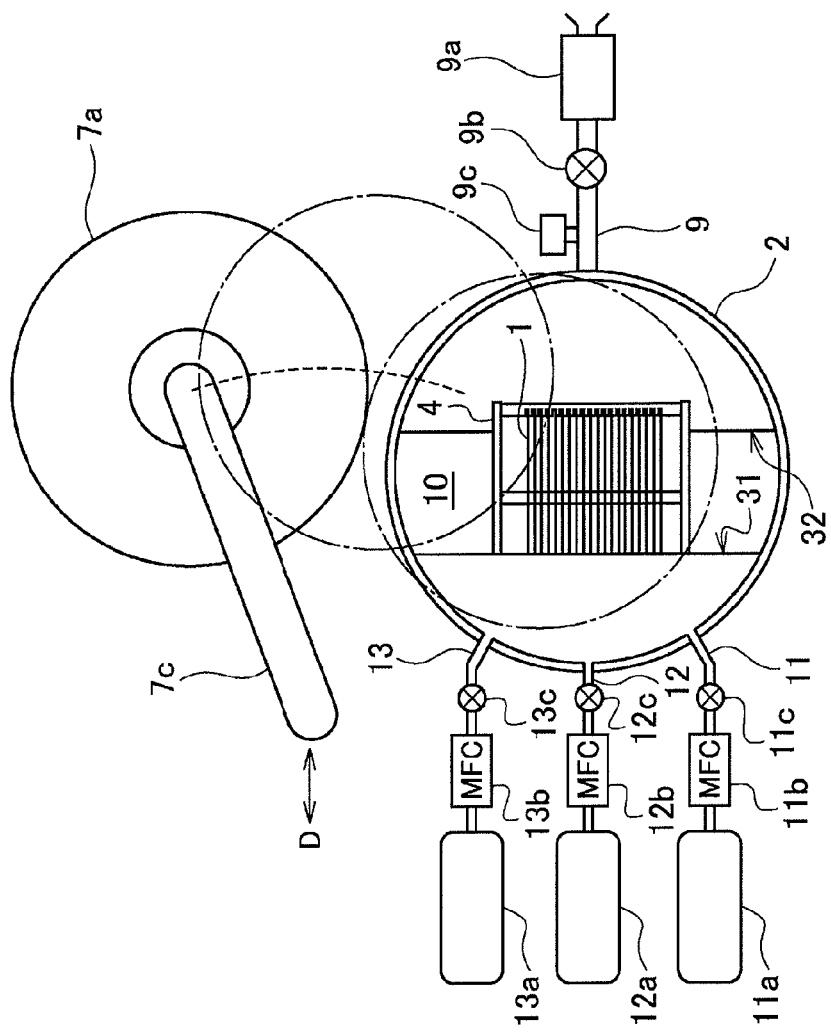
FIG. 2 is a side view of the substrate processing apparatus relevant to the first embodiment of the present invention, when an opening (carrying port) is opened by a cover.
Figure 4:
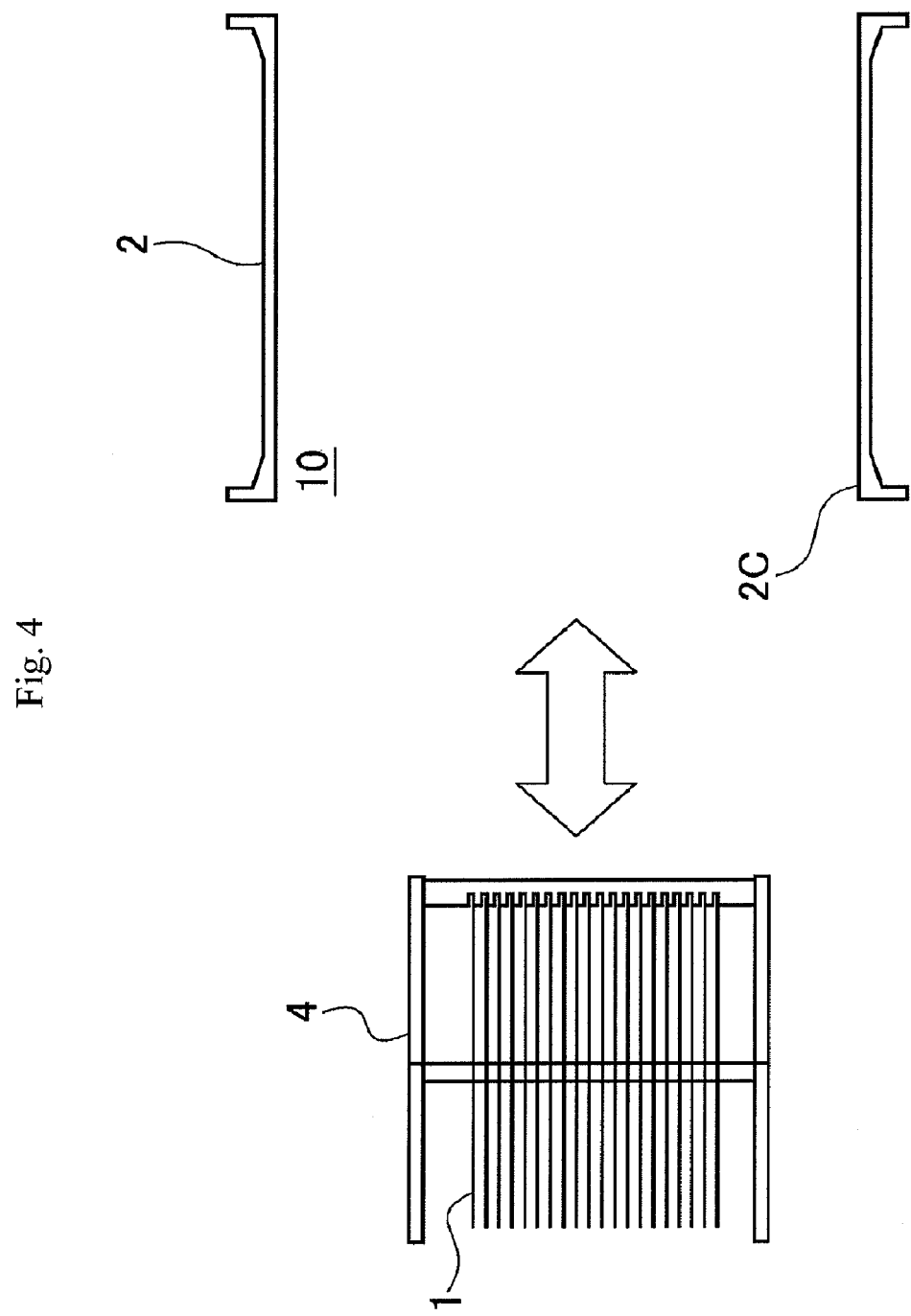
FIG. 4 is a schematic view illustrating a boat which holds a wafer and is loaded into and unloaded from the inside and outside of the substrate processing apparatus relevant to the first embodiment of the present invention.
Figure 8:
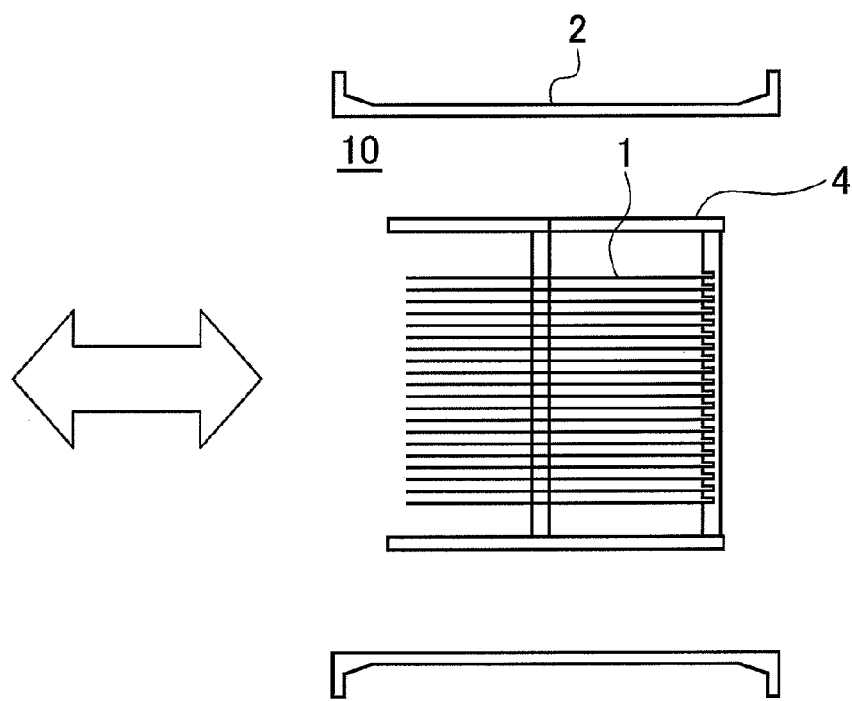
FIG. 8 is a vertical cross-sectional view illustrating a boat which holds a wafer and is loaded into the process vessel of the substrate processing apparatus relevant to the first embodiment of the present invention.
Figure 9:
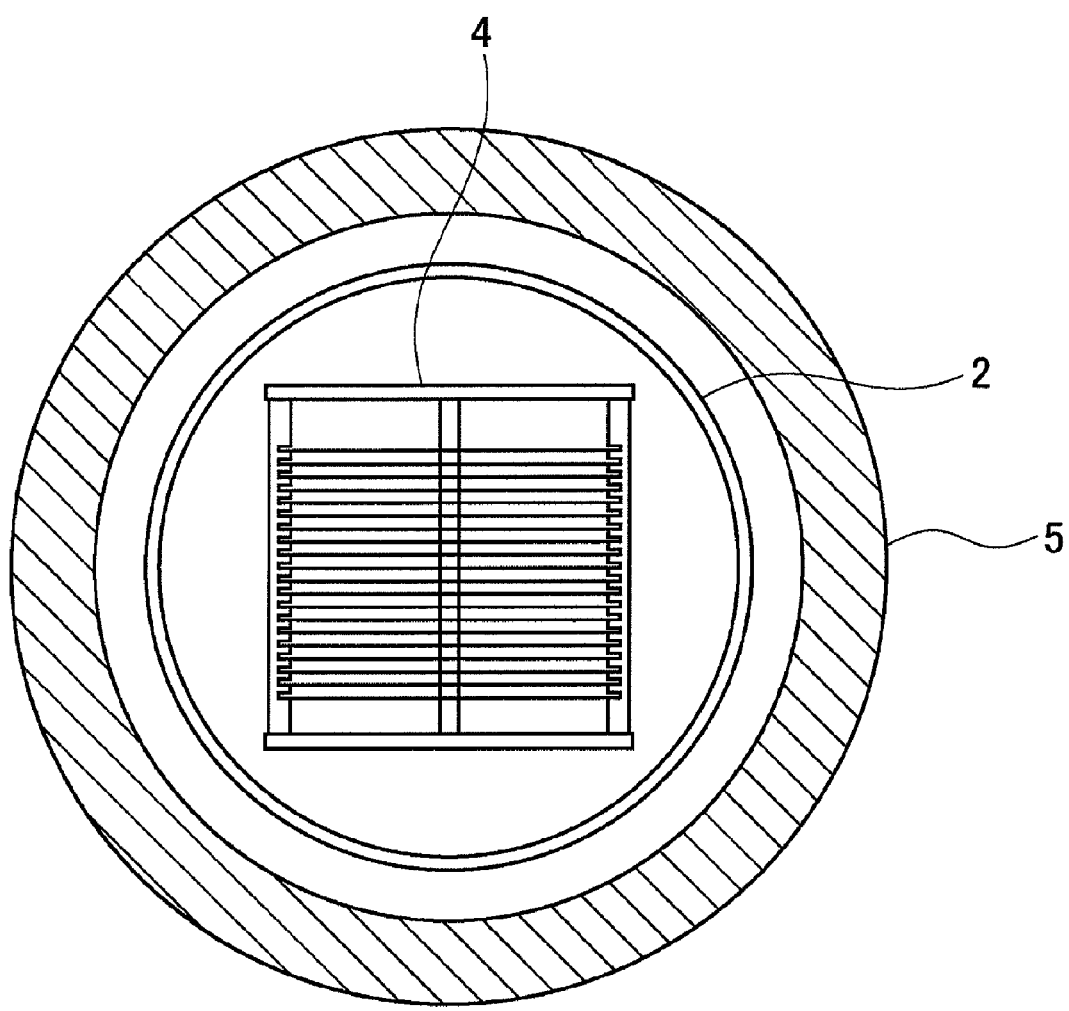
FIG. 9 is a vertical cross-sectional view illustrating a process vessel and a heating device of the substrate processing apparatus relevant to the first embodiment of the present invention.

First, the constitution of the substrate processing apparatus relevant to the first embodiment of the present invention will be described with reference to the attached drawings. FIG. 1A is a plan cross-sectional view of the substrate processing apparatus relevant to the first embodiment of the present invention, and FIG. 1B is a side view taken from the side of a gas introduction port of FIG. 1A. FIG. 2 is a side view of the substrate processing apparatus relevant to the first embodiment of the present invention, when an opening (carrying port) is opened by a cover. FIG. 4 is a schematic view illustrating a boat which holds a wafer and is loaded into and unloaded from the inside and outside of the substrate processing apparatus relevant to the first embodiment of the present invention. FIG. 8 is a vertical cross-sectional view illustrating a boat which holds a wafer and is loaded into the process vessel of the substrate processing apparatus relevant to the first embodiment of the present invention. FIG. 9 is a vertical cross-sectional view illustrating the process vessel and the heating device of the substrate processing apparatus relevant to the first embodiment of the present invention.

(Process Vessel)

As illustrated in FIG. 1 and FIG. 2, the substrate processing apparatus relevant to the current embodiment includes a cylindrical process vessel 100. The process vessel 100 includes a cylindrical process tube 2 having a first opening 2a and a second opening 2b on both ends thereof (both side parts being a ceiling part and a bottom part), a first manifold 6a installed in the first opening 2a of the process tube 2, and a second manifold 6b installed in the second opening 2b of the process tube 2. In addition, the shape of the process vessel 100 is not necessarily limited to the cylindrical shape, and the process vessel 100 may be configured by a polygonal tube with a polygonal cross section. However, when the process vessel 100 is formed in the cylindrical shape, the strength of the process vessel 100 can be further increased.

Figure 3:
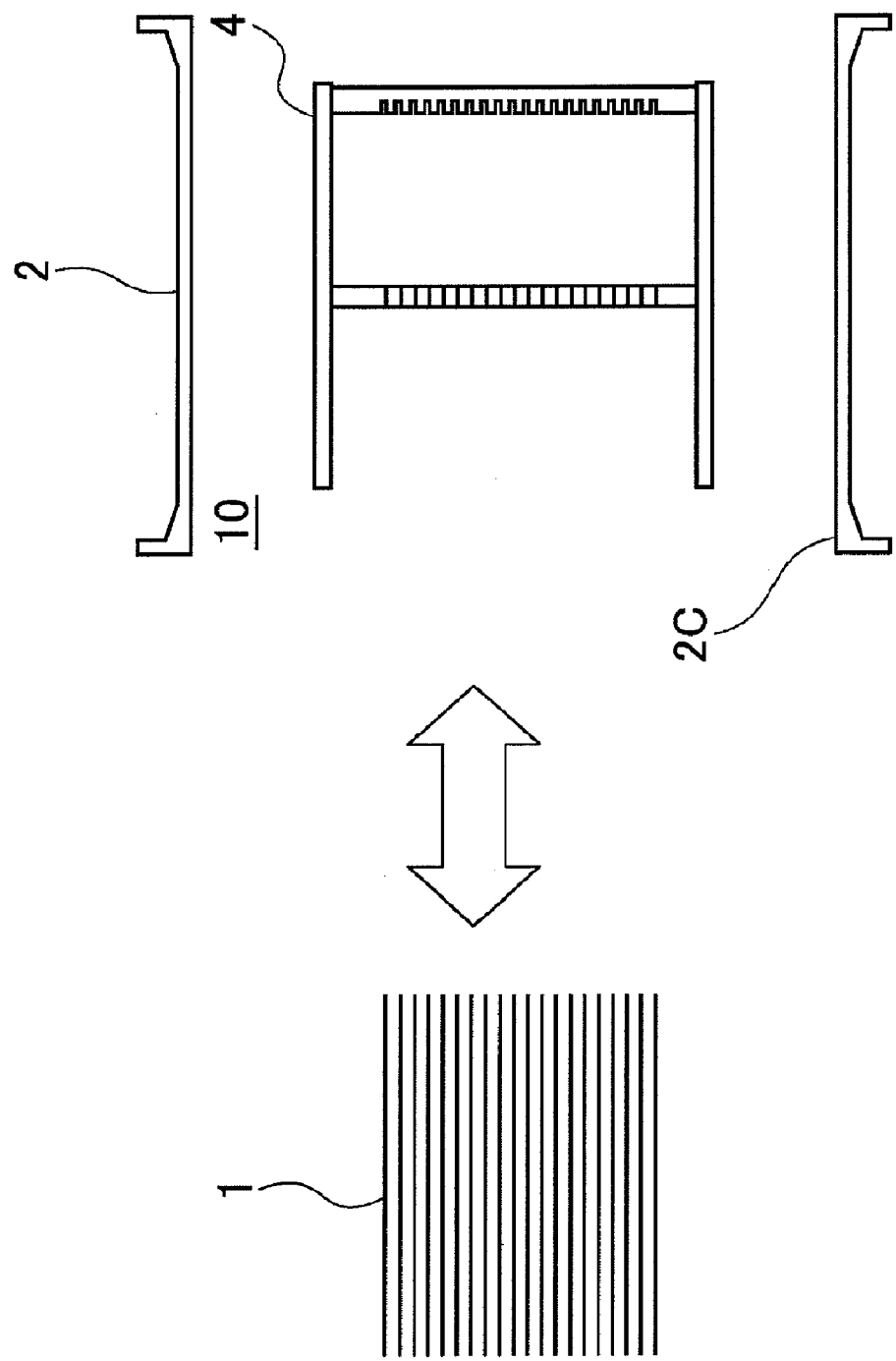
FIG. 3 is a schematic view illustrating a case where a wafer is carried at a horizontal position to the inside and outside of a process vessel of a substrate processing apparatus relevant to another embodiment of the present invention.

The first manifold 6a is configured to form a periphery of the first side of the process vessel 100. In addition, as illustrated in FIG. 3, an opening (carrying port) 6c is formed opposite to a side which is attached to the process tube 2 at the first manifold 6a, and is configured to be opened or closed by a cover 7a. At the cover 7a, an arm 7c for moving the cover 72 is installed. A driving control unit 20d is connected to the arm 7c. The driving control unit 20d is configured to control an operation of the arm 7c so that the opening (carrying port) 6c is opened or closed at a desired timing. Furthermore, the second manifold 6b is configured to form a periphery of the second side of the process vessel 100. An opening is formed opposite to a side which is attached to the process tube 2 at the second manifold 6b, and is configured to be air-tightly sealed by a cover 7b.

At the inside of the process vessel 100, a process chamber 10 is configured to accommodate and process wafers 1 which are horizontally held substrates. Specifically, the inside of the process vessel 100 is configured to accommodate a boat 4 which is a substrate holding unit charged with wafers 1 horizontally held and vertically arranged in multiple stages. Furthermore, in order to reduce a useless space inside the process vessel 100, it is preferable that the width of the boat 4 (the width of the boat 4 in a diameter direction of the wafer 1) is substantially equal to the height of the boat 4 (the height of the boat 4 in a stacked direction of the wafer 1).

Meanwhile, the process tube 2 and the boat 4 are made of a heat-resistant nonmetal material such as quartz ($SiO_2$) or silicon carbide (SiC). Furthermore, the first manifold 6a, the second manifold 6b, the cover 7a and the cover 7b are made of a metal such as stainless steel (SUS).

(Gas Introduction Port)

In an adjacent region of the first side of the process vessel 100, that is, the sidewall of the first manifold 6a, gas introduction ports 11d, 12d and 13d are installed to introduce gas from a lateral side of the wafer 1 to the inside of the process vessel 100. Gas supply pipes 11, 12 and 13 are connected to the gas introduction ports 11d, 12d and 13d respectively. At the gas supply pipes 11 and 12, gas supply sources 11a and 12a for supplying various process gases such as dichlorosilane ($SiH_2Cl_2$) gas, nitrous oxide ($N_2O$) gas and nitride gas as film forming gas, mass flow controllers 11b and 12b as flow rate controllers, and on-off valves 11c and 12c are installed sequentially from the upstream side. Furthermore, at the gas supply pipe 13, a gas supply source 13a for supplying inert gas such as $N_2$ gas or Ar gas, a mass flow controller 13b as a flow rate controller, and an on-off valve 13c are installed sequentially from the upstream side. The number of the gas introduction ports may be less than three, or equal to or greater than four according to kinds of the substrate processing. Furthermore, gap between the gas introduction ports at the side of the first manifold 6a may be properly adjusted according to the shape of the process vessel 100, the size of the wafer 1, and the kinds of the substrate processing. Preferably, the gas introduction ports 11d, 12d and 13d are arranged in parallel at the substantially same height in order to make it easy to supply the same amounts of the dichlorosilane gas and the nitrous oxide gas to each wafer 1 arranged at a different height inside the boat 4 and also make it easy to supply the inert gas to each wafer 1 arranged at a different height. In addition, the film forming gas is not limited to the above-mentioned gases. For example, silane ($SiH_4$) gas, or dichlorosilane gas and ammonia ($NH_3$) gas may be used. Furthermore, not only the film forming gas but doping gas or oxide gas or annealing gas may be used. Moreover, the on-off valves 11c, 12c and 13c and the mass flow controllers 11b, 12b and 13b are electrically connected to a gas flow rate control unit 20b. The gas flow rate control unit 20b is configured to control the operations of the on-off valves 11c, 12c and 13c and the mass flow controllers 11b, 12b and 13b in order that the flow rate of the gas supplied into the process vessel 100 may be set to a predetermined level at a predetermined timing.

(Gas Exhaust Port)

In an adjacent region of the second side of the process vessel 10, that is, the sidewall of the second manifold 6b, a gas exhaust port 9d is installed to exhaust gas inside the process vessel 100 from a lateral side of the wafer 1. An exhaust pipe 9 is connected to the gas exhaust port 9d. At the exhaust pipe 9, an Auto Pressure Controller (APC) valve 9b, which is a pressure controller for controlling pressure inside the process vessel 100, and a vacuum exhaust device 9a are installed sequentially from the upstream side. Furthermore, a pressure gauge 9c is installed in an adjacent region above the APC valve 9b of the exhaust pipe 9. The vacuum exhaust device 9a, the APC valve 9b and the pressure gauge 9c are electrically connected to a pressure control unit 20c. The pressure control unit 20c is configured to control opening of the APC valve 9b, based upon a pressure level detected by the pressure gauge 9c, in order that pressure inside the process vessel 100 may be set to a predetermined level at a desired timing.

Meanwhile, as illustrated in FIG. 1A, the gas introduction ports 11d, 12d and 13d and the gas exhaust port 9d are arranged at opposite positions (diagonal positions of the process vessel 100), with the wafer 1 inside the process vessel 100 being inserted therebetween. For example, a straight line connecting the gas introduction ports 11d, 12d and 13d and the gas exhaust port 9d passes through a the central region of the wafer 1 held in the inside of the process vessel 100.

Due to the above-described structure, the gas supplied into the process vessel 100 circulates through the gap between the wafers 1 stacked in a vertical direction and thereafter the gas is exhausted to the outside of the process vessel 100 through the gas exhaust port 9d. As the gas contacts the surface of the wafer 1, a desired process such as film formation, oxidation or nitridation is accomplished. In the current embodiment, the gas is introduced from a lateral side of the wafer 1 held at a horizontal position and is exhausted through a lateral side of the wafer 1 opposite to the gas introduction ports 11d, 12d and 13d, so that the gas flows in a direction parallel to the principal surface of the wafer 1, not in a stacked direction of the wafer 1. Therefore, the gas easily flows to the central region of the surface of the stacked wafer 1, and thus, a gas flow rate at the peripheral region of the wafer 1 is almost identical to a gas flow rate at the central region of the wafer 1. Furthermore, it is possible to prevent the amount of the gas supplied to the downstream region from being reduced by gas consumption in the upstream region, and the amount of the gas supplied to each wafer 1 can be more uniform independently of the holding position (height) of the wafer 1 inside the boat 4.

(Slope Part)

At the inside of the process vessel 100 between the gas introduction ports 11d, 12d and 13d and the gas exhaust port 9d, slope parts 31 and 32 are installed to define the gas flow path for guiding a flow of the gas introduced into the process vessel 100. The slope parts 31 and 32 are made of quartz ($SiO_2$) or silicon carbide (SiC).

Specifically, in a region inside the process vessel 100 (that is, the process tube 2) where the gas introduction ports 11d, 12d and 13d are installed, the slope part 31 is installed to guide the flow of the gas introduced into the process vessel 100. Also, in a region inside the process vessel 100 (that is, the process tube 2) where the gas exhaust port 9d is installed, the slope part 32 is installed to guide the flow of the gas introduced into the process vessel 100. Furthermore, although it is more preferable to install both of the slope part 31 and the slope part 32, the present invention is not necessarily limited thereto. The present invention may have either of the slope part 31 and the slope part 32.

In addition, it is preferable that the slope part 31 is installed to extend at least from the adjacent region of the gas introduction ports 11d, 12d and 13d to the loading area of the wafer 1 in the inside of the process vessel 100. Furthermore, it is preferable that the slope part 32 is installed to extend at least from the loading are of the wafer 1 to the gas exhaust port 9d in the inside of the process vessel 100. The slope part 31 and the slope part 32 relevant to the current embodiment are installed to extend from the first opening to the second opening of the process tube 2.

A portion of the gas flow guided by the slope parts 31 and 32 is sloped in a direction different from a direction directed from the gas introduction ports 11d, 12d and 13d to the gas exhaust port 9d, in order that the gas flow path inside the process vessel 100 may be longer than the straight distance between the gas introduction ports 11d, 12d and 13d and the gas exhaust port 9d.

Specifically, as illustrated in FIG. 1A, in the midstream region of the gas flow inside the process vessel 100 (a region around the wafer 1), a portion 31a of the wall of the slope part 31 installed in an adjacent region of the gas introduction port 11d, 12d and 13d), and a portion 32a of the wall surface of the slope part 32 installed in an adjacent region of the gas exhaust port 9d are sloped in a direction different from a direction directed from the gas introduction ports 11d, 12d and 13d to the gas exhaust port 9d (for example, direction connecting the first manifold 6a, which is installed opposite to the side where the gas introduction ports 11d, 12d and 13d are installed, and the second manifold 6b, which is opposite to the side where the gas exhaust port 9d is installed), with the wafer 1 being loaded in parallel along its diameter direction.

In addition, in the upstream region of the gas flow inside the process vessel 100 (an adjacent region of the gas introduction ports 11d, 12d and 13d), the wall surface 31b of the slope part 31 installed in an adjacent region of the gas introduction port 11d, 12d and 13d, and the inner wall surface of the first side of the process tube 100 (inner wall surface of the process chamber 10 formed by the cover 7a) are configured to be parallel to each other. That is, at the first opening 2a of the process tube 2, a first flange 2c is formed by the process tube 2 and the slope part 31, and the width of the flange installed in the adjacent region of the gas introduction ports 11d, 12d and 13d is wider than the width of the flange installed in the region opposite to the gas introduction ports 11d, 12d and 13d.

Furthermore, in the downstream region of the gas flow inside the process vessel 100 (an adjacent region of the gas exhaust port 9d), the wall surface 32b of the slope part 32 installed in an adjacent region of the gas exhaust port 9d, and the inner wall surface of the second side of the process tube 100 (inner wall surface of the process chamber 10 formed by the cover 7b) are configured to be parallel to each other. That is, at the second opening 2b of the process tube 2, a second flange 2d is formed by the process tube 2 and the slope part 32, and the width of the flange installed in the adjacent region of the gas exhaust port 9d is wider than the width of the flange installed in the region opposite to the gas exhaust port 9d.

Due to the formation of the slope parts 31 and 32, the gas flow guided by the slope parts 31 and 32 inside the process vessel 100 is curved in Z-shape as indicated by an arrow in FIG. 1A. That is, the gas flow of the upstream region (adjacent region of the gas introduction ports 11d, 12d and 13d) is in parallel to the inner wall surface of the first side of the process vessel 100 (inner wall surface of the process chamber 10 formed by the cover 7a), and the gas flow of the midstream region (region around the wafer 1) is sloped in a direction different from a direction directed from the gas introduction ports 11d, 12d and 13d to the gas exhaust port 9d. The gas flow of the downstream region (adjacent region of the gas exhaust port 9d) is in parallel to the inner wall surface of the first side of the process vessel 100 (inner wall surface of the process chamber 10 formed by the cover 7a). As a result, the gas flow path defined by the slope parts 31 and 32 inside the process vessel 100 is longer than the straight distance between the gas introduction ports 11d, 12d and 13d and the gas exhaust port 9d. That is, as the distance of laminar flow until the gas introduced into the process vessel 100 reaches the wafer 1 extends, the gas supplied to the surface of the wafer 1 can be preheated sufficiently. Furthermore, as illustrated in FIG. 1B, it is preferable that, when looking the boat 4 from the side of the opening 6c, the distance of laminar flow can further extend if the slope part 31 protrudes at the inside of the process chamber 10 so that a portion of the boat 4 is concealed by the slope part 31. Likewise, it is preferable that, when looking the boat 4 from the side of the opening 6c, the gas flow distance can further extend if the slope part 32 protrudes at the inside of the process chamber 10 so that a portion of the boat 4 is concealed by the slope part 32.

Moreover, in order to suppress the slope parts 31 and 32 from being damaged by pressure difference, it is preferable that a space between the slope part 31 and the process vessel 100, a space between the slope part 32 and the process vessel 100, and the process chamber 10 communicate with one another. For example, it is preferable that through-holes are formed at a portion of sidewalls of the slope parts 31 and 32.

(Heating Device)

As illustrated in FIG. 1A and FIG. 9, a heating device 5 surrounding an outer periphery of the process vessel 100 (process tube 2) is installed to heat the wafer 1 inside the process vessel 100. For example, the heating device 5 is configured with an ohmic heating heater. Furthermore, a wafer temperature sensor (not shown) for sensing temperature of the wafer 1 is installed at a position which is around the wafer 1 inside the process vessel 100 and at which it is difficult to disturb the gas flow reaching the wafer 1 (for example, a downstream side lower than the wafer 1, a space between the wall surface of the slope part 31 and the wafer 1, and a space between a portion 32a of the wall surface of the slope part 32 and the wafer 1). A temperature control unit 20a is connected to the heating device 5 and the wafer temperature sensor. The temperature control unit 20a is configured to control an electrified amount of the heating device 5, based upon the temperature sensed by the wafer temperature sensor, in order that the surface of the wafer 1 inside the process vessel 100 may be heated to a predetermined temperature at a predetermined timing.

Furthermore, as indicated by an imaginary line in FIG. 1A, a preheating device 5b for preheating the gas supplied into the process vessel 100 until it reaches the wafer 1 may be installed in the outer periphery of the process vessel 100 in a way that it surrounds the first side region (the sidewall of the first manifold 6a or the sidewall of the cover 7a) instead the region where the heating device 5 is installed. Moreover, at the position which is upper than the wafer 1 and at which it is difficult to disturb the gas flow reaching the wafer 1 (for example, adjacent region of the sidewall of the cover 7a, a portion 31a of the wall surface of the slope part 31, and a portion 32a of the wall surface of the slope part 32), a gas temperature sensor (not shown) may be installed to measure temperature of the gas supplied to the wafer 1. In this case, the temperature control unit 20a is connected to the heating device and the gas temperature sensor. The temperature control unit 20a is configured to control an electrified amount of the heating device, based upon the temperature sensed by the gas temperature sensor, in order that the gas supplied to the wafer 1 may be heated to a predetermined temperature.

(Carrying Device)

The substrate processing apparatus relevant to the current embodiment includes a carrying device (not shown) carrying the wafer 1 into or out of the process vessel 100 along the flow path of the midstream region guided by the slope parts 31 and 32. Specifically, as illustrated in FIG. 4, the carrying device is configured to carry the boat 4 charged with the wafer 1 into or out of the process vessel 100 through the opening (carrying port) 6c of the first manifold 6a opened by the opening the cover 7a. The driving control unit 20d is connected to the carrying device. The driving control unit 20d is configured to control the operation of the carrying device in order that the boat 4 may be carried in and out at a desired timing. Furthermore, the present invention is not limited to the above embodiment. For example, as illustrated in FIG. 3, the carrying device may be configured to charge or discharge the wafer 1 into or from the boat 4 which is previously loaded into the process vessel 100 through the opening (carrying port) 6c of the first manifold 6a opened by opening the cover 7a.

(Controller)

The temperature control unit 20a, the gas flow rate control unit 20b, the pressure control unit 20c, and the driving control unit 20d are configured with a manipulation unit and an input/output unit, and are electrically connected to a main control unit (not shown) for controlling an overall operation of the substrate processing apparatus. The temperature control unit 20a, the gas flow rate control unit 20b, the pressure control unit 20c, the driving control unit 20d, and the main control unit 89 are configured as a controller 20.

(2) Operation of Substrate Processing Apparatus

A substrate processing performed by the substrate processing apparatus relevant to the current embodiment will be described hereinafter. For example, the substrate processing relevant to the current embodiment is performed as one of manufacturing processes of the semiconductor device. Also, in the following description, operations of the respective parts of the substrate processing apparatus are controlled by the controller 20.

(Process of Loading Substrate)

The wafer 1 to be processed is charged into the boat 4. The opening (carrying port) 6c of the process vessel 100 is opened by opening the cover 7a. After the boat 4 is loaded into the process vessel 100 by the carrying device (not shown), the carrying device is withdrawn to the outside of the process tube 100, and the process tube 100 is air-tightly sealed by closing the cover 7a. As a result, at the inside of the process tube 100, a plurality of wafers 1 are maintained horizontally in multiple stages.

Thereafter, the vacuum exhaust device 9a is operated while the on-off valves 11c and 12c are in a closed state, and the APC valve 9b is opened to evacuate the process vessel 100 to a desired pressure. At this point, while controlling the flow rate by using the mass flow controller 13b, the on-off valve 13c may be opened so that inert gas continues to be supplied into the process vessel 100.

Also, the heating device 5 heats the wafer 1 inside the process vessel 100 so that its surface has a desired temperature.

(Substrate Processing)

While introducing the gas into the process vessel 100 from the lateral side of the wafer 1 by the gas introduction ports 11d and 12d installed around the first side of the process vessel 100, the gas is supplied to the wafer 1 by exhausting the gas inside the process vessel 100 from the lateral side of the wafer 1 by the gas exhaust port 9d installed around the second side of the process vessel 100 which is opposite to the first side. Specifically, while continuing to evacuate the process vessel 100 by the vacuum exhausting device 9a, the on-off valves 11c and 12c are opened to supply a process gas into the process vessel 100. At this point, the mass flow controllers 11b and 12b control the flow rate of the gas supplied into the process vessel 100.

The gas supplied into the process vessel 100 circulates through the space between the wafers 1 stacked in a vertical direction and then is exhausted from the gas exhaust port 9d to the outside of the process vessel 100. As the gas contacts the surface of the wafer 1, a desired processing such as film formation, oxidation or nitridation is accomplished. In addition, in the current embodiment, since the gas is introduced from the lateral side of the wafer 1 horizontally held and is exhausted from the lateral side of the wafer 1 which is opposite to the gas introduction ports 11d and 12d, the gas easily flows the central region of the wafer 1, and there is almost no difference between a gas supply rate at the peripheral region of the wafer 1 and a gas flow rate at the central region of the wafer 1. Furthermore, there is almost no difference in the gas flow rate to each wafer 1 according to the holding position (height) of the wafer 1 inside the boat 4.

In addition, the gas supplied into the process vessel 100 is guided by the slope parts 31 and 32 and circulated in Z-shape as indicated by an arrow Z in FIG. 1A. That is, the gas flow of the upstream region (adjacent region of the gas introduction ports 11d and 12d) is parallel to the inner wall surface of the first side of the process vessel 100 (inner wall surface of the process chamber 10 formed by the cover 7a), and the gas flow of the midstream region (region around the wafer 1) is sloped in a direction different from a direction directed from the gas introduction ports 11d, 12d and 13d to the gas exhaust port 9d. The gas flow of the downstream region (adjacent region of the gas exhaust port 9d) is parallel to the inner wall surface of the first side of the process vessel 100 (inner wall surface of the process chamber 10 formed by the cover 7a). As a result, the gas flow path defined by the slope parts 31 and 32 inside the process vessel 100 is longer than the straight distance between the gas introduction ports 11d, 12d and 13d and the gas exhaust port 9d. That is, since the distance of laminar flow until the gas introduced into the process vessel 100 reaches the wafer 1 extends, the gas supplied to the surface of the wafer 1 can be preheated sufficiently. For example, when a silicon oxide film is formed on the wafer 1, dichlorosilane gas is supplied at a flow rate of 200 sccm, nitrogen dioxide gas is supplied at a flow rate of 400 sccm, and the process chamber 10 is maintained at 50-100 Pa and heated to 700-800° C.

When a predetermined process on the wafer 1 is completed, the on-off valves 11c and 12c are closed while the APC valve 9b is in an opened state, and the process gas remaining inside the process vessel 100 is exhausted. In addition, since the on-off valve 13c is in the opened state, the exhaust of the process gas remaining inside the process vessel 100 is accelerated and the inside of the process vessel 100 is purged with inert gas.

(Process of Unloading Substrate)

Thereafter, the opening of the APC valve 9b is adjusted, and the on-off valve 13c is opened to supply inert gas so that the inside of the process vessel 100 is increased to atmospheric pressure. By moving the cover 7a, the opening (carrying port) 6c of the process vessel 100 is opened. The boat 4 charged with the processed wafer 1 is unloaded by the carrying device (not shown), and the substrate processing is finished.

(3) Effects relevant to Current Embodiment

The current embodiment has one or more of the following effects.

In accordance with the current embodiment, in order to introduce gas from the lateral side of the wafer 1 held at a horizontal position and exhaust the introduced gas from the lateral side of the wafer 1 opposite to the gas introduction ports 11d, 12d and 13d, the gas flows in a direction parallel to the principal surface of the wafer 1, not the stacked direction of the wafer 1. Therefore, the gas easily flows to the central region of the surface of the stacked wafer 1, and thus, there is almost no difference between a gas supply rate at the peripheral region of the wafer 1 and a gas flow rate at the central region of the wafer 1, so that the substrate can be processed more uniformly over the surface of the wafer 1. Furthermore, it is possible to prevent the amount of the gas supplied to the downstream region from being reduced by gas consumption in the upstream region, and the amount of the gas supplied to each wafer 1 can be more uniform independently of the holding position (height) of the wafer 1 inside the boat 4. Since the loading effect is suppressed, dummy wafers need not be charged at the upper or lower part of the boat 4, more wafers 1 can be batch-processed, and the productivity of the substrate processing can be improved.

Also, in accordance with the current embodiment, due to the formation of the slope part 31, the gas flow guided by the slope part 31 inside the process vessel 100 is curved before it reaches the wafer 1 as indicated by an arrow Y in FIG. 1A. Therefore, since the distance of laminar flow until the gas introduced into the process vessel 100 reaches the wafer 1 extends, the gas supplied to the surface of the wafer 1 can be preheated sufficiently. As a result, the substrate processing speed to the wafer 1 can be increased, and the productivity of the substrate processing can be improved. Furthermore, by making the surface temperature of the wafer 1 close to the temperature of the gas supplied to the wafer 1, the surface temperature of the wafer 1 can become more uniform and the substrate processing can be performed more uniformly over the plurality of wafers 1 in a vertical direction and also over the surfaces of the wafers 1. Moreover, since the distance of laminar flow inside the process vessel 100 extends, the "distance of laminar flow" section installed in the outside of the process vessel 100 can be shortened, and the dimension of the substrate processing apparatus can be reduced.

In addition, in accordance with the current embodiment, due to the formation of the slope part 32, the gas flow guided by the slope part 32 inside the process vessel 100 is curved between the wafer 1 and the gas exhaust port 9d as indicated by the arrow Z in FIG. 1A. As a result, the distance until the gas passing through the wafer 1 reaches the gas exhaust port 9d extends so that the inside of the process vessel 100 is exhausted uniformly. That is, if the wafer 1 and the gas exhaust port 9d are too close, the flow speed in the adjacent region of the gas exhaust port 9d becomes fast, so that the exhaust balance inside the process vessel 100 is disturbed and the pressure condition and the gas concentration distribution between the plurality of wafers 1 in a vertical direction become different. However, since the gas is guided by the slope part 32, the inside of the process vessel 100 can be exhausted uniformly and the substrate processing can be performed more uniformly over the plurality of wafers 1 in a vertical direction. Moreover, since the gas exhaust distance inside the process vessel 100 extends, the dimension of the substrate processing apparatus can be reduced.

Furthermore, in accordance with the current embodiment, due to the formation of the slope parts 31 and 32, the gas flow guided by the slope parts 31 and 32 inside the process vessel 100 is curved in Z-shape as indicated by the arrow Z in FIG. 1A. As a result, due to the slope parts 31 and 32, the gas flow distance inside the process vessel 100 becomes longer than the straight distance from the gas introduction ports 11d, 12d and 13d to the gas exhaust port 9d. In addition, due to the slope parts 31 and 32, the gas can be integrated toward the wafer 1, and the useless space inside the process chamber 10 can be reduced. As a result, the substrate processing can be performed more uniformly over the plurality of wafers 1 arranged in a vertical direction and also over the surfaces of the wafers 1.

Furthermore, in accordance with the current embodiment, the heating device may be installed at the outer periphery of the process vessel 100 in a way that it surrounds the first side region (the sidewall of the first manifold 6a or the sidewall of the cover 7a) rather than the region where the heating device 5 is installed. In this case, the gas introduced into the process vessel 100 can be preheated sufficiently until it reaches the wafer 1.

Furthermore, in accordance with the current embodiment, the boat 4 charged with the wafer 1 can be carried along the flow path of the midstream region guided by the slope parts 31 and 32. The boat 4 can be carried into or out of the process vessel 100 through the opening (carrying port) 6c of the first manifold 6a opened by opening the cover 7a. That is, the boat 4 need not be moved upward and downward when the wafer 1 is loaded into and unloaded from the process vessel 100. Therefore, the heat history (heat input amount) to each wafer 1 can be more uniform over the wafers 1, and the substrate processing can be performed more uniformly. In addition, the tack time of the substrate processing can be reduced. Furthermore, since the boat 4 can be carried into or out of the process vessel 100, without moving it upward and downward, the vertical-direction dimension of the substrate processing apparatus can be reduced.

Furthermore, in accordance with the current embodiment, the strength of the process vessel 100 can be increased by forming the process vessel 100 in a cylindrical shape.

Moreover, in accordance with the current embodiment, as illustrated in FIG. 1A, the gas introduction ports 11d, 12d and 13d are installed at the side of the first manifold 6a, and the gas exhaust port 9d is installed at the side of the second manifold 6b. Due to the installation of the gas introduction ports 11d, 12d and 13d and the gas exhaust port 9d in the above-described direction, the dimension of the substrate processing apparatus can be reduced.

Second Embodiment of the Present Invention

Figure 5:
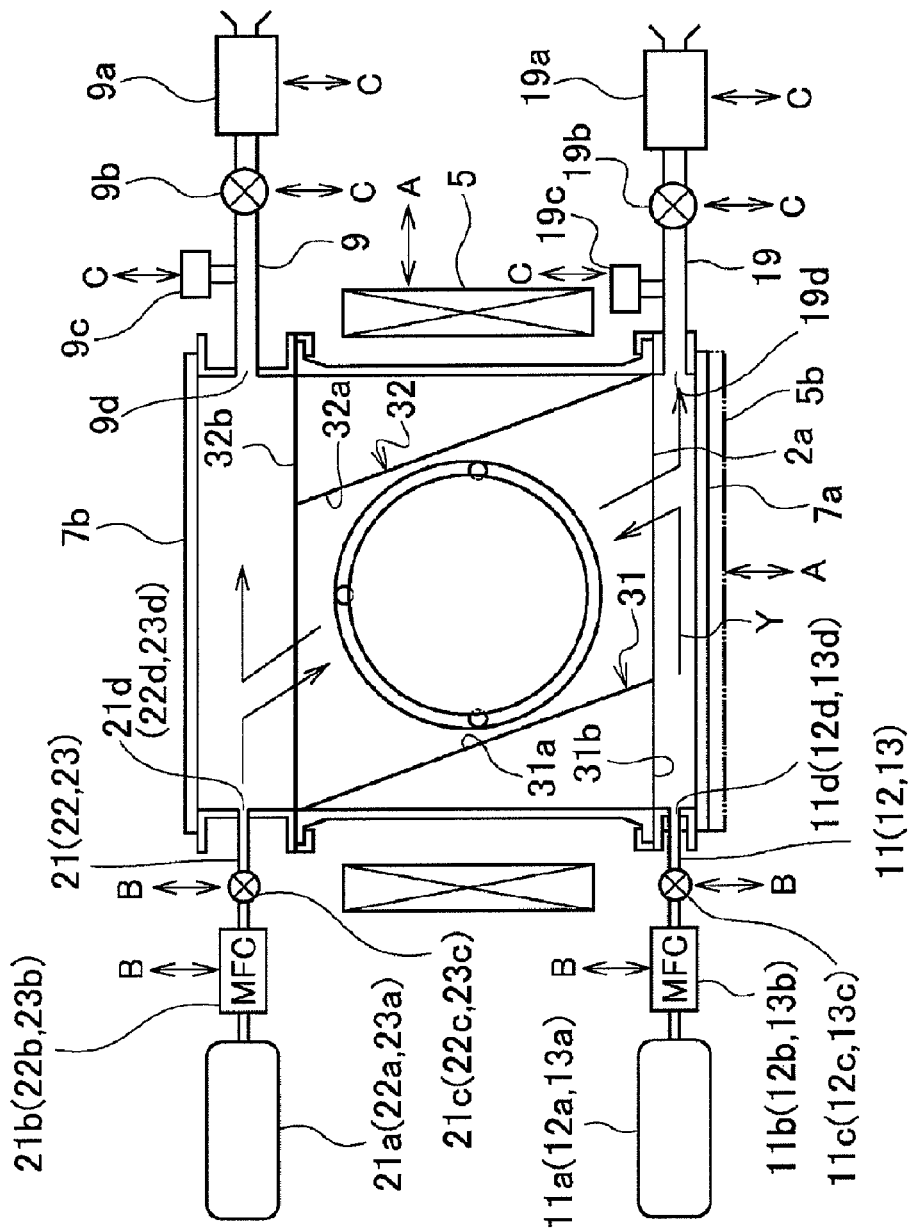
FIG. 5 is a plan cross-sectional view of a substrate processing apparatus relevant to a second embodiment of the present invention.

The second embodiment of the present invention will be described hereinafter with reference to the attached drawings. FIG. 5 is a plan cross-sectional view of a substrate processing apparatus relevant to the second embodiment of the present invention.

In accordance with the first embodiment, the gas introduction ports 11d, 12d and 13d are provided only in the peripheral region of the first side of the process vessel 100 (that is, the side of the first manifold 6a), and the gas exhaust port 9d is provided only in the peripheral region of the second side of the process vessel 100 (that is, the side of the second manifold 6b). However, in accordance with the second embodiment, in the peripheral region of the second side of the process vessel 100 (side of the second manifold 6b), gas introduction ports 21d, 22d and 23d are further provided at the substantially same height as the gas introduction ports 11d, 12d and 13d. Also, in the peripheral region of the first side of the process vessel 100 (side of the first manifold 6a), a gas exhaust port 19d is further provided. The other structure is almost the same as the first embodiment.

Also, as illustrated in FIG. 5, the gas introduction ports 21d, 22d and 23d and the gas exhaust port 19d are arranged at opposite positions (diagonal positions of the process vessel 100), with the wafer 1 inside the process vessel 100 being inserted therebetween. For example, a straight line connecting the gas introduction ports 21d, 22d and 23d and the gas exhaust port 9d passes through the central region of the wafer 1 held in the inside of the process vessel 100.

Gas supply pipes 21, 22 and 23 are connected to the gas introduction ports 21d, 22d and 23d respectively. At the gas supply pipes 21 and 22, gas supply sources 21a and 22a for supplying process gases, mass flow controllers 21b and 22b as flow rate controllers, and on-off valves 21c and 22c are installed sequentially from the upstream side. Furthermore, at the gas supply pipe 23, a gas supply source 23a for supplying inert gas, a mass flow controller 23b as a flow rate controller, and an on-off valve 23c are installed sequentially from the upstream side. The number of the gas introduction ports may be less than three, or equal to or greater than four according to kinds of the substrate processing. Furthermore, the gap between the gas introduction ports at the side of the second manifold 6b can be properly adjusted according to the shape of the process vessel 100, the size of the wafer 1, and the kinds of the substrate processing. Preferably, the gas introduction ports 21d and 22d and the gas introduction port 23d are arranged at the substantially same height in order to make it easy to supply the inert gas to each wafer 1 arranged at a different height inside the boat 4. In addition, a gas flow rate controller 20b is connected to the on-off valves 21c, 22c and 23c and the mass flow controllers 21b, 22b and 23b. The gas flow rate control unit 20b is configured to control the operations of the on-off valves 21c, 22c and 23c and the mass flow controllers 21b, 22b and 23b in order that the flow rate of the gas supplied into the process vessel 100 may be set to a predetermined level at a predetermined timing.

An exhaust pipe 19 is connected to the gas exhaust port 19d. At the exhaust pipe 19, an Auto Pressure Controller (APC) valve 19b as a pressure controller for controlling pressure inside the process vessel 100, and a vacuum exhaust device 19a are installed sequentially from the upstream side. Furthermore, a pressure gauge 19c is installed in an upstream region above the APC valve 19b of the exhaust pipe 19. The vacuum exhaust device 19a, the APC valve 19b and the pressure gauge 19c are electrically connected to a pressure control unit 20c. The pressure control unit 20c is configured to control opening of the APC valve 19b, based upon a pressure level detected by the pressure gauge 19c, in order that pressure inside the process vessel 100 may be set to a predetermined level at a desired timing.

The substrate processing process relevant to the current embodiment is almost the same as the first embodiment, except for "the process of supplying gas to the substrate".

Like the first embodiment, in the "process of supplying gas to the substrate", while introducing the gas into the process vessel 100 from the lateral side of the wafer 1 by the gas introduction ports 11d, 12d and 13d installed in the adjacent region of the first side of the process vessel 100, the gas is supplied to the wafer 1 by exhausting the gas inside the process vessel 100 from the lateral side of the wafer 1 by the gas exhaust port 19d installed in the adjacent region of the second side of the process vessel 100 opposite to the first side.

After the gas supply from the gas introduction ports 11d, 12d and 13d is performed for a predetermined time, the gas supply from the gas introduction ports 11d, 12d and 13d and the gas exhaust from the gas exhaust port 9d are stopped at the same time. That is, the on-off valves 11c, 12c and 13c are closed and simultaneously the APC valve 9b is closed.

While introducing the gas into the process vessel 100 from the lateral side of the wafer 1 by the gas introduction ports 21d, 22d and 23d installed in the adjacent region of the second side of the process vessel 100, the gas is supplied to the wafer 1 by exhausting the gas inside the process vessel 100 from the lateral side of the wafer 1 by the gas exhaust port 19d installed in the adjacent region of the first side of the process vessel 100 opposite to the second side.

After the gas supply from the gas introduction ports 21d, 22d and 23d is performed for a predetermined time, the gas supply from the gas introduction ports 21d, 22d and 23d and the gas exhaust from the gas exhaust port 9d are stopped at the same time. That is, the on-off valves 21c, 22c and 23c are closed and simultaneously the APC valve 9b is closed. Thereafter, if necessary, the gas supply from the gas introduction ports 11d, 12d and 13d and the gas supply from the gas introduction port 21d is set as 1 cycle, and this cycle is repeated several times to perform a predetermined process on the wafer 1.

When the predetermined process on the wafer 1 is completed, the on-off valves 11c, 12c, 13c, 21c, 22c and 23c are closed while the APC valves 9b and 19b are in an opened state, and the process gas remaining inside the process vessel 100 is exhausted. In this way, the "process of supplying the gas to the substrate" is finished. In addition, since the on-off valve 13c is in the opened state, the exhaust of the process gas remaining inside the process vessel 100 is accelerated and the inside of the process vessel 100 is purged with inert gas.

In the first embodiment, the flow paths of the gas introduced from the gas introduction ports 11d, 12d and 13d and exhausted through the gas exhaust port 9d are almost identical to each other, and the preheating time is almost identical to each other. However, according to the kinds of the substrate processing, the gas with short preheating time may be used, the gas requiring no preheating may be used, or the gas to which the preheating is not preferable may be used. On the contrary, in accordance with the current embodiment, the preheating time can be adjusted by changing the flow path according to types of the gas introduced into the process vessel 100. That is, the flow path of the gas introduced from the gas introduction port 21d and exhausted through the gas exhaust port 19d can be made shorter than the flow path of the gas introduced from the gas introduction ports 11d, 12d and 13d and exhausted through the gas exhaust port 9d. Also, the preheating time of the gas introduced from the gas introduction port 21d and exhausted through the gas exhaust port 19d can be made shorter than the preheating time of the gas introduced from the gas introduction ports 11d, 12d and 13d and exhausted through the gas exhaust port 9d. For example, as the process gas supplied from the gas introduction ports 11d and 12d, nitrogen dioxide gas is supplied which starts to be decomposed at temperature higher than dichlorosilane gas. As the process gas supplied from the gas introduction ports 21d and 22d, dichlorosilane gas is supplied which starts to be decomposed at temperature lower than nitrogen dioxide gas. In this way, $SiO_2$ film is formed on the wafer 1.

Furthermore, in accordance with the current embodiment, the inside of the process vessel 100 can be exhausted by using both of the gas exhaust port 9d and the gas exhaust port 19d. Therefore, the pressure control inside the process vessel 100 can be performed more rapidly, and the tact time of the substrate processing is reduced to improve the productivity.

Third Embodiment of the Present Invention

Figure 6:
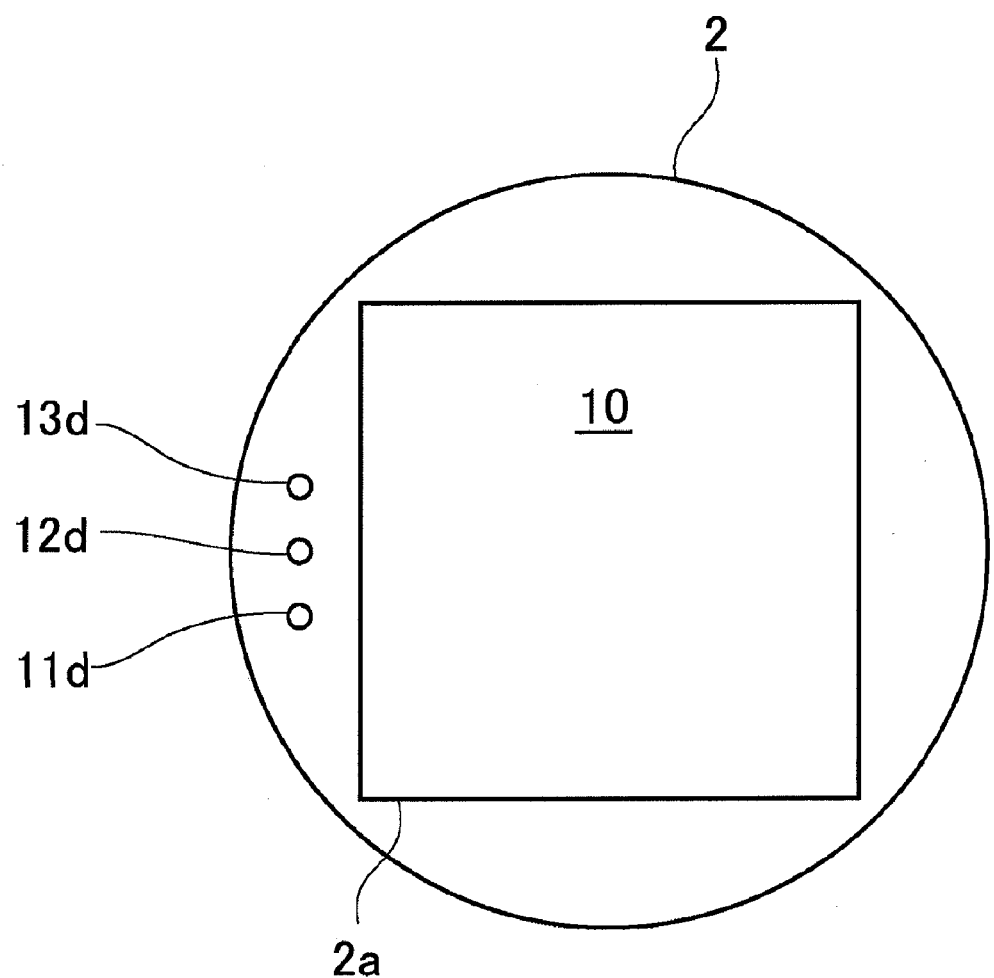
FIG. 6 is a side view of a process tube constituting a process vessel relevant to a third embodiment of the present invention.
Figure 7:
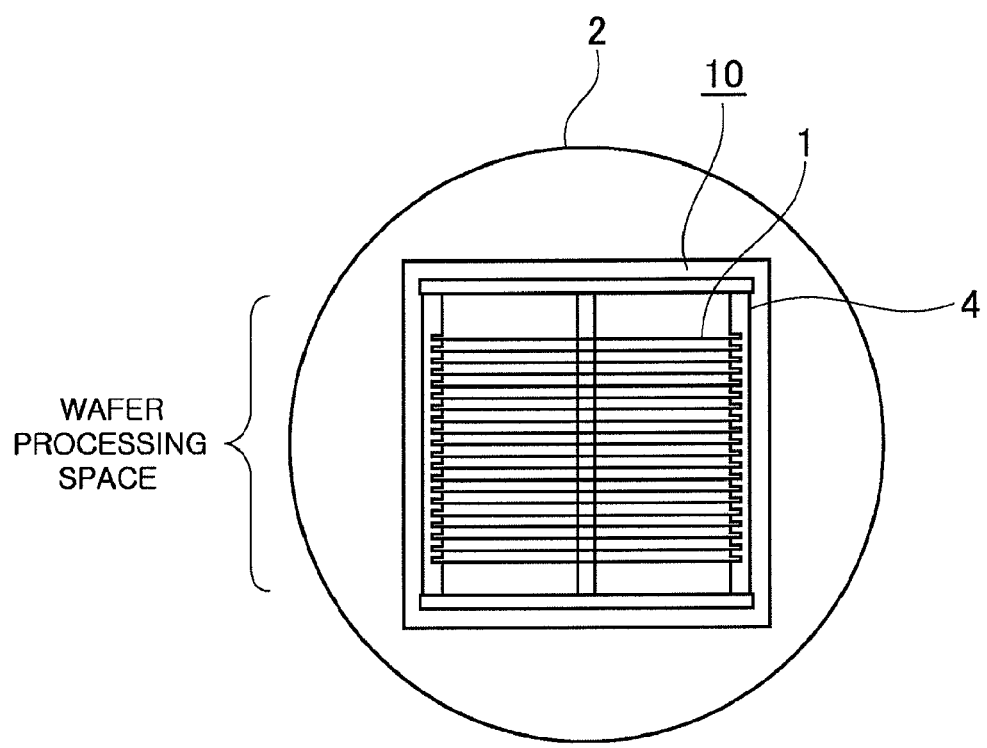
FIG. 7 is a side view of the process tube constituting the process vessel relevant to the third embodiment of the present invention, in a case where a boat is loaded into the process tube.

The third embodiment of the present invention will be described hereinafter with reference to the attached drawings. FIG. 6 is a side view of a process tube constituting a process vessel relevant to the third embodiment of the present invention. FIG. 7 is a side view of the process tube constituting the process vessel relevant to the third embodiment of the present invention, in a case where a boat is loaded into the process tube.

The process vessel 100 relevant to the first embodiment includes the cylindrical process tube 2 having the first opening 2a and the second opening 2b on both ends thereof (both side parts being a ceiling part and a bottom part), the first manifold 6a made of a metal and installed in the first opening 2a of the process tube 2, and the second manifold 6b made of a metal and installed in the second opening 2b of the process tube 2. The gas introduction ports 11d, 12d and 13d and the gas exhaust port 9d are installed in the first manifold 6a and the second manifold 6b respectively.

On the contrary, the current embodiment differs from the first embodiment in that the process vessel 100 relevant to the current embodiment has no first manifold 6a and second manifold 6b as illustrated in FIGS. 6 and 7. In the current embodiment, the gas introduction ports 11d, 12d and 13d are installed in the adjacent region of the first opening 2a of the process tube 2 made of quartz ($SiO_2$) or silicon carbide (SiC), and the gas exhaust port 9d is installed in the adjacent region of the second opening 2b of the process tube 2. In addition, the first opening 2a of the process tube 2 is configured to be opened or closed by the cover 7a having an inner wall covered with quartz ($SiO_2$) or silicon carbide (SiC), and the second opening 2b of the process tube 2 is configured to be air-tightly sealed by the cover 7b having an inner wall covered with quartz (SiO$_2$) or silicon carbide (SiC). Furthermore, at the inside of the process tube 2, the slope parts 31 and 32 are formed, and thus, the flow path of the gas introduced into the process tube 2 is curved in Z-shape like the first embodiment. The other structure is almost the same as the first embodiment.

In accordance with the current embodiment, the metal material is not exposed at the inner wall of the process vessel 100. Therefore, it is possible to suppress metal contamination from be generated at the process vessel 100 and the wafer 1 loaded into the process vessel 100.

Also, in accordance with the current embodiment, the process tube 2 and the cover 7b may be integrally formed. In addition, the gas exhaust port 9d may be installed at the cover 7b, not in the adjacent region of the first opening 2a of the process tube 2. Furthermore, even though the inner wall of the cover 7a and the cover 7b are not covered with quartz or silicon carbide, the generation of the metal contamination can be suppressed by at least the absence of the manifold made of a metal.

Fourth Embodiment of the Present Invention

Figure 10:
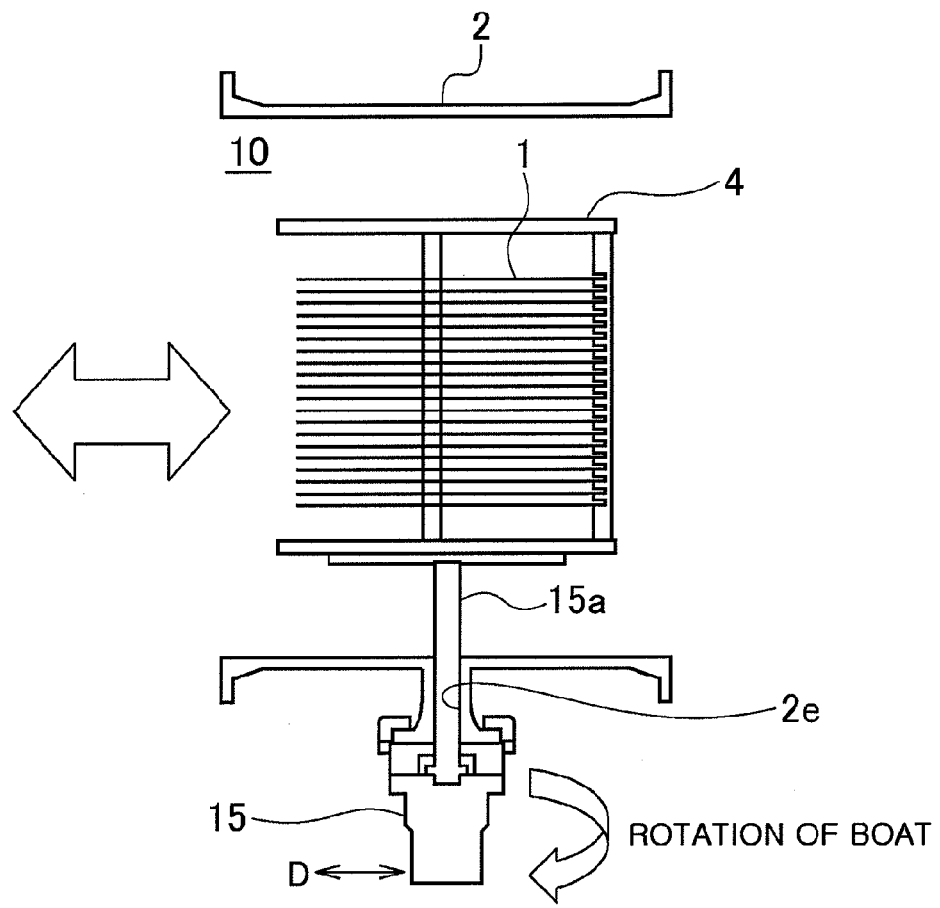
FIG. 10 is a vertical cross-sectional view of a process vessel relevant to a fourth embodiment of the present invention.
Figure 11:
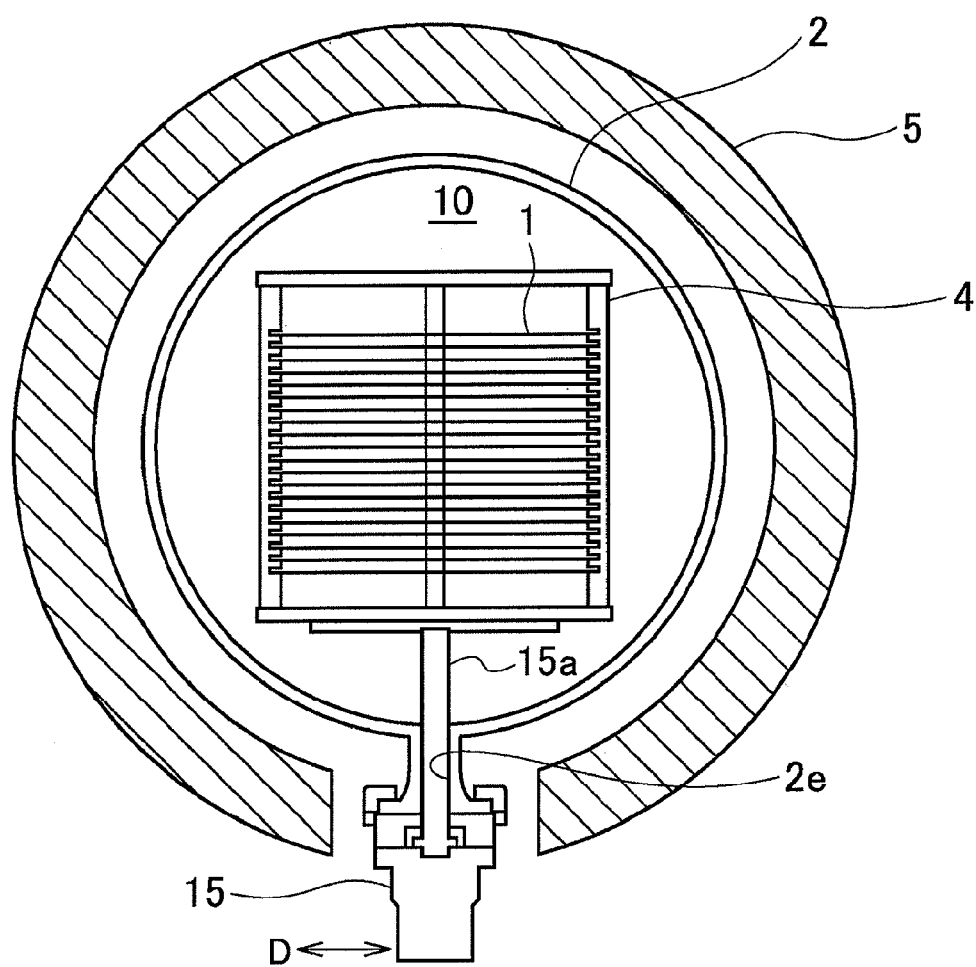
FIG. 11 is a vertical cross-sectional view of a process vessel relevant to the fourth embodiment of the present invention.

The fourth embodiment of the present invention will be described hereinafter with reference to the attached drawings. FIG. 10 and FIG. 11 are vertical cross-sectional views of a process vessel relevant to the fourth embodiment of the present invention. Specifically, FIG. 10 is a vertical cross-sectional view taken along a cylindrical shaft direction of the process vessel 100, and FIG. 11 is a vertical cross-sectional view taken along a different direction orthogonal to FIG. 10.

The substrate processing apparatus relevant to the current embodiment differs from the above-described embodiments in that the boat 4 holding the wafer 1 is configured to be rotated inside the process vessel 100. The other structure is almost the same as the above-described embodiments.

Specifically, as illustrated in FIG. 10 and FIG. 11, the through-hole 2e passing through the cylindrical part of the process tube 2 is installed at the lower part of the process vessel 100. A rotation shaft 15a passes through the through-hole 2e. The upper part of the rotation shaft 15a supports the boat 4 loaded into the process vessel 100 from the lower side. The lower part of the rotation shaft 15a is supported by a rotating mechanism 15. By supporting the lower part of the rotation shaft 15a by the rotating mechanism 15, it is possible to rotate the boat 4 and the wafer 1 inside the process vessel 100. A driving control unit 20d is connected to the rotating mechanism 15. The driving control unit 20d is configured to control the operation of the rotating mechanism 15 so that the boat 4 and the wafer 1 are rotated at a desired timing.

Also, the substrate processing process relevant to the current embodiment differs from the above-described embodiments in that the boat 4 and the wafer 1 are rotated by operating the rotating mechanism 15 in the process of supplying the gas to the substrate. Due to the rotation of the wafer 1, the surface temperature of the wafer 1 becomes more uniform, and the gas supply amount to the wafer 1 becomes more uniform over the surface of the wafer 1. Thus, the substrate processing can be performed more uniformly over the surface of the wafer 1.

Fifth Embodiment of the Present Invention

Figure 12:
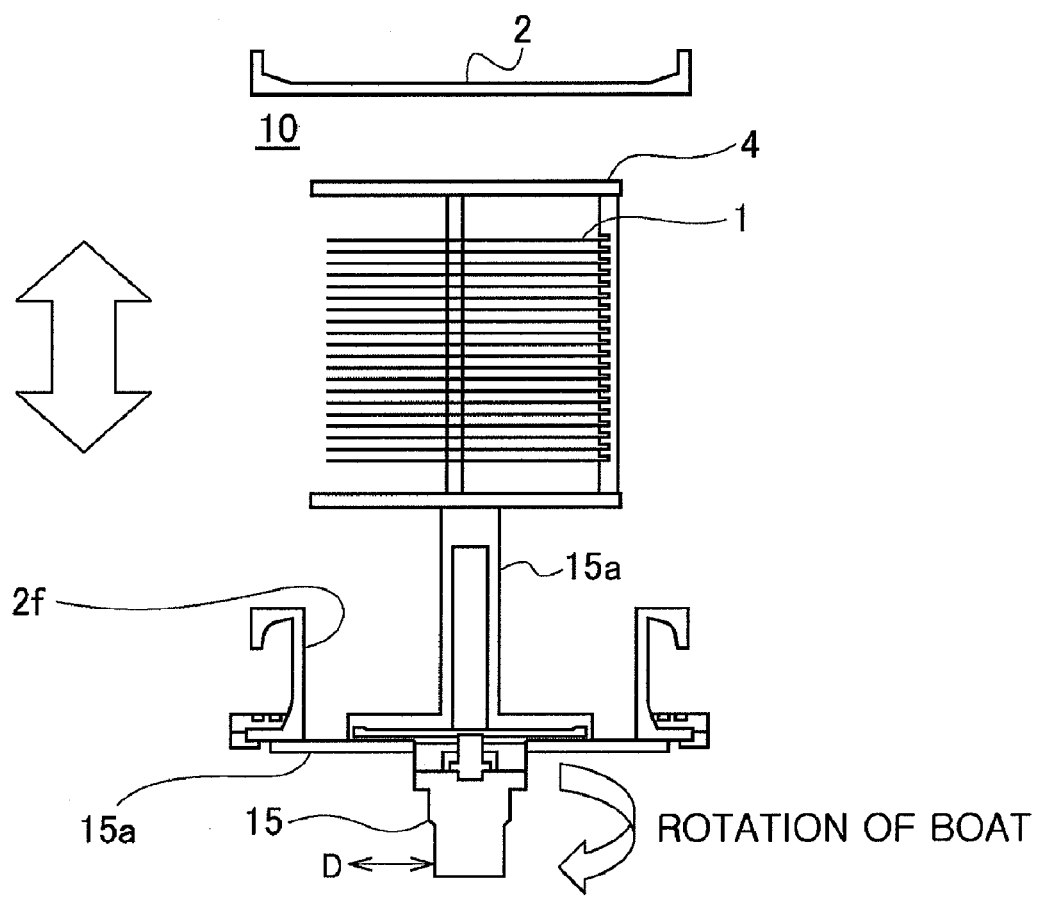
FIG. 12 is a vertical cross-sectional view of a process vessel relevant to a fifth embodiment of the present invention.
Figure 13:
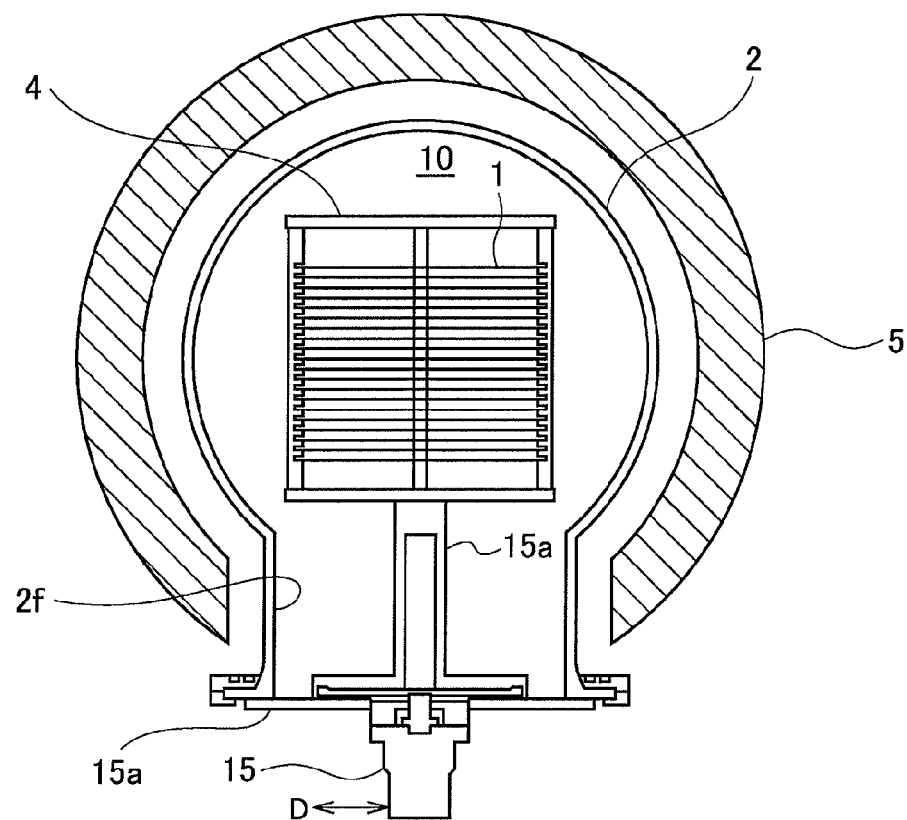
FIG. 13 is a vertical cross-sectional view of a process vessel relevant to the fifth embodiment of the present invention.

The fifth embodiment of the present invention will be described hereinafter with reference to the attached drawings. FIG. 12 and FIG. 13 are vertical cross-sectional views of a process vessel relevant to the fifth embodiment of the present invention. Specifically, FIG. 12 is a vertical cross-sectional view taken along a cylindrical shaft direction of the process vessel 100, and FIG. 13 is a vertical cross-sectional view taken along a different direction orthogonal to FIG. 12. Also, if the through-hole 2e is arranged at the substantially center position in the lower part of the process vessel 100, the space inside the process vessel 100 can be used efficiently.

As illustrated in FIG. 12 and FIG. 13, the current embodiment differs from the fourth embodiment in that a boat carrying port 2f is installed at a lower part of the process vessel 100. The other structure is almost the same as the fourth embodiment. An opening diameter of the boat carrying port 2f is greater than a diameter (diameter in a horizontal direction) of the boat 4. The rotating mechanism 15 loading the boat 4 above the rotation shaft 15a is moved upward by an elevating mechanism (not shown), so that the boat 4 can be carried into or out of the process vessel 100. When the boat 4 is carried into the process vessel 100, the boat carrying port 2f is airtightly sealed by a seal cap 15b installed at a horizontal position in the lower part of the rotation shaft 15a. Therefore, when maintenance is performed on the boat 4 or the rotation shaft 15a, they can be easily taken out from the process vessel 100, thus making it possible to enhance the maintenance of the substrate processing apparatus.

Sixth Embodiment of the Present Invention

Figure 14:
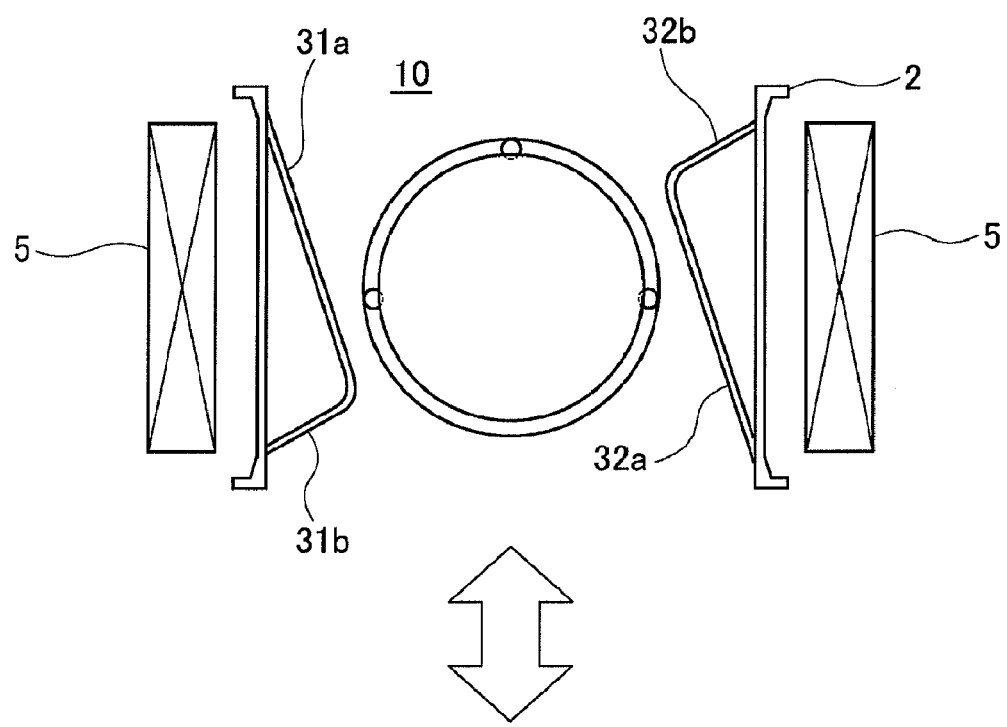
FIG. 14 is a plan cross-sectional view of a process vessel relevant to a sixth embodiment of the present invention.
Figure 15:
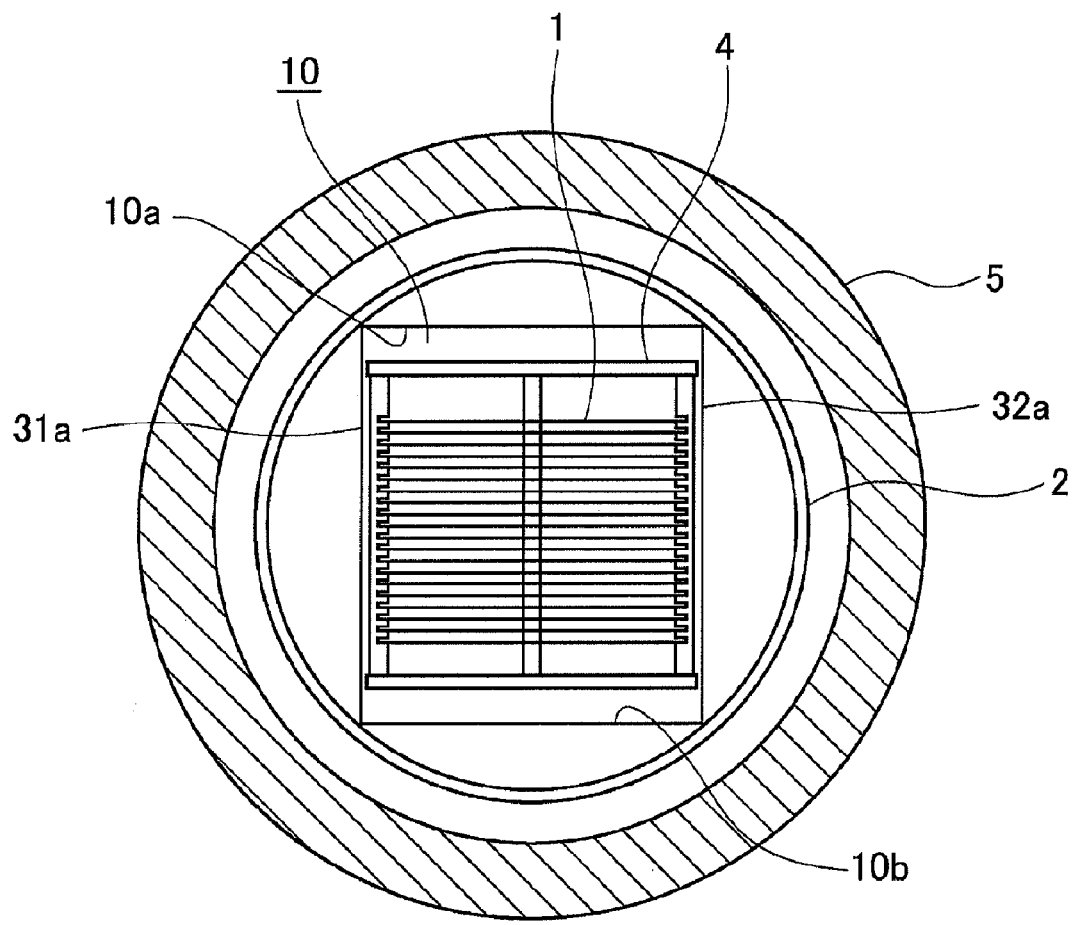
FIG. 15 is a vertical cross-sectional view of a process vessel relevant to the sixth embodiment of the present invention.

The sixth embodiment of the present invention will be described hereinafter with reference to the attached drawings. FIG. 14 and FIG. 15 are vertical cross-sectional views of a process vessel relevant to the sixth embodiment of the present invention. Specifically, FIG. 14 is a vertical cross-sectional view taken along a cylindrical shaft direction of the process vessel 100, and FIG. 15 is a vertical cross-sectional view taken along a different direction orthogonal to FIG. 14.

As illustrated in FIG. 14 and FIG. 15, the substrate processing apparatus relevant to the current embodiment includes the slope parts 31 and 32, the ceiling wall 10a at the ceiling part inside the process chamber 10, and the lower wall 10b at the lower part inside the process chamber 10. In addition, the gap between at least the upper part of the boat 4 loaded into the process vessel 100 and the inner wall (ceiling wall 10a) of the process chamber 10, and the gas between the lower part of the boat 4 and the inner wall (lower wall 10b) of the processing chamber 10 become narrower. In this way, the gas introduced into the process vessel 100 can be suppressed from escaping to the gap between the peripheral part of the boat 4 and the inner wall of the process chamber 10, and the gas supply between the wafers 1 held in the boat 4 can be facilitated. As a result, since the gas use efficiency is improved, the gas waste can be prevented and the substrate processing speed can be increased.

Seventh Embodiment of the Present Invention

Figure 16:
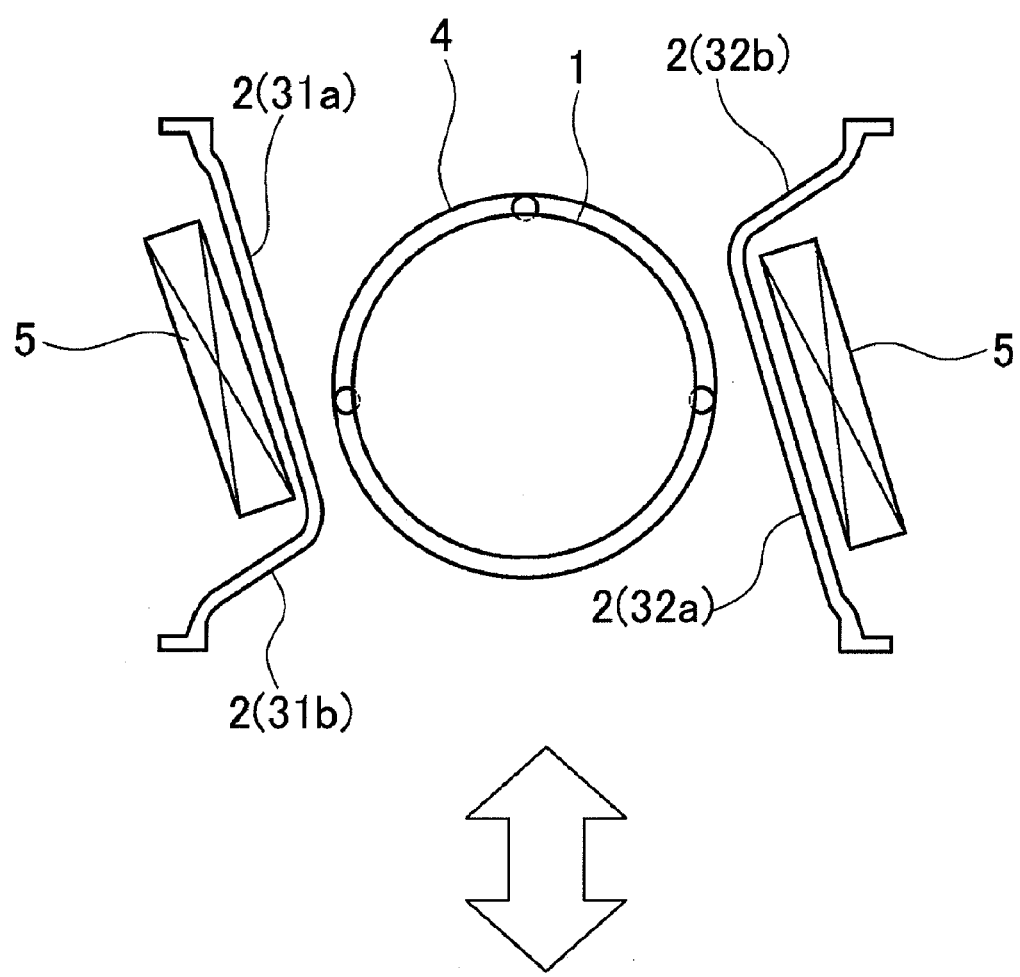
FIG. 16 is a plan cross-sectional view of a process vessel relevant to a seventh embodiment of the present invention.
Figure 17:
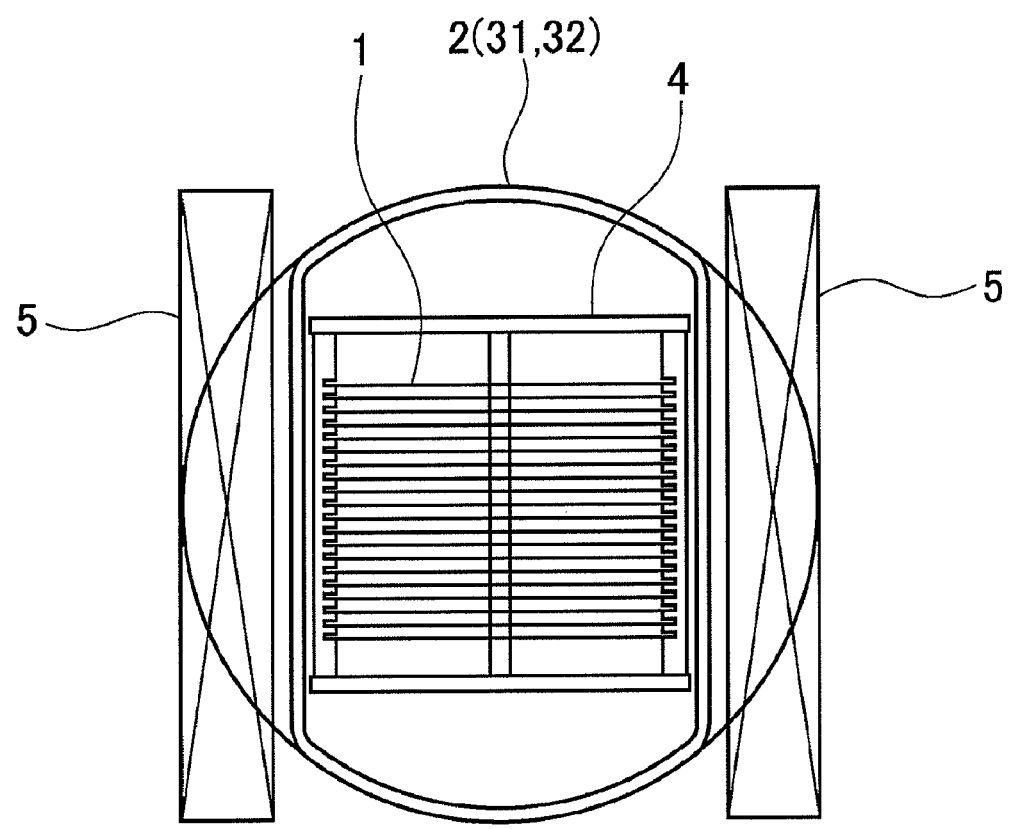
FIG. 17 is a vertical cross-sectional view of a process vessel relevant to the seventh embodiment of the present invention.

The seventh embodiment of the present invention will be described hereinafter with reference to the attached drawings. FIG. 16 and FIG. 17 are vertical cross-sectional views of a process vessel relevant to the seventh embodiment of the present invention. Specifically, FIG. 16 is a vertical cross-sectional view taken along a cylindrical shaft direction of the process vessel 100, and FIG. 17 is a vertical cross-sectional view taken along a different direction orthogonal to FIG. 14.

In the substrate processing apparatus relevant to the current embodiment, as illustrated in FIG. 16, the slope parts 31 and 32 are configured by the inner wall of the process tube 2. Furthermore, as illustrated in FIG. 17, the cross section of the process tube 2 except for the first opening 2a has an elliptical shape. Also, the sidewall inside the process tube 2 except for the first opening 2a is configured with a vertical plane along the stacked direction of the wafer 1. The heating device 5 is installed in a vertical direction along the sidewall of the process tube 2 and along the flow path around the midstream of the gas flow inside the process vessel 100.

As a result, the distance between the peripheral part of the wafer 1 held in the boat 4 and the heating device 5 becomes almost constant, independently of the holding position (height) of the wafer 1 inside the boat 4. Therefore, the heat conditions between the wafers 1 can be made uniform, and the substrate processing can be performed more uniformly over the wafers 1. Furthermore, the peripheral part of the wafer 1 held in the boat 4 and the heating device 5 can be arranged close to each other, the heating efficiency can be increased, and the reactivity of the temperature control can be increased.

(Supplementary Note)

The present invention also includes the following embodiments.

(Supplementary Note 1)

In accordance with an embodiment of the present invention, there is provided a substrate processing apparatus, comprising: a process vessel configured to accommodate and process a substrate held at horizontally; a gas introduction port installed in an adjacent region of a first side of the process vessel and configured to introduce a gas into the process vessel from a lateral side of the substrate; a gas exhaust port installed in a second side of the process vessel opposite to the first side, and configured to exhaust the gas inside the process vessel from a lateral side of the substrate; and a slope part installed between the gas introduction port and the gas exhaust port inside the process vessel, and configured to define a gas flow path for guiding a flow of the gas introduced into the process vessel.

(Supplementary Note 2)

In the substrate processing apparatus of Supplementary Note 1, it is preferable that the gas introduction port and the gas exhaust port are arranged at opposite positions, with the substrate being inserted therebetween, and the slope part is installed in at least an installation region of the gas introduction port inside the process vessel to be disposed between the gas introduction port and the gas exhaust port.

(Supplementary Note 3)

In the substrate processing apparatus of Supplementary Note 2, it is preferable that the slope part is installed to extend at least from an adjacent region of the gas introduction port to a substrate loading region inside the process vessel.

(Supplementary Note 4)

In the substrate processing apparatus of Supplementary Note 1, it is preferable that the gas introduction port and the gas exhaust port are arranged at opposite positions, with the substrate being inserted therebetween, and the slope part is installed in at least an installation region of the gas exhaust port inside the process vessel to be disposed between the gas introduction port and the gas exhaust port.

(Supplementary Note 5)

In the substrate processing apparatus of Supplementary Note 4, it is preferable that the slope part is installed to extend at least from a substrate loading region to the gas exhaust port inside the process vessel.

(Supplementary Note 6)

In the substrate processing apparatus of Supplementary Note 4, it is preferable that the substrate processing apparatus further comprises: a heating device installed in an outer periphery of the process vessel and configured to heat the substrate inside the process vessel; and a preheating device installed at a periphery of the process vessel to surround the first side instead of a region where the heating device is installed, and configured to preheat the gas introduced into the process vessel.

(Supplementary Note 7)

In the substrate processing apparatus of Supplementary Note 1, it is preferable that the process vessel comprises a process tube having a first opening at an end portion thereof; and a first manifold installed in the first opening of the process tube, and wherein the gas introduction port is installed in the first manifold, a gas supply pipe is connected to the gas introduction port, and the slope part is installed inside the process tube.

(Supplementary Note 8)

In the substrate processing apparatus of Supplementary Note 7, it is preferable that the substrate processing apparatus further comprising a first flange at the first opening of the process tube, wherein a width of the flange in a region where the gas introduction port is installed is greater than that of the flange opposite to the region where the gas introduction port is installed.

(Supplementary Note 9)

In the substrate processing apparatus of Supplementary Note 1, it is preferable that the substrate processing apparatus further comprises: a substrate holding unit configured to accommodate the substrate horizontally, the substrate being vertically stacked inside the process vessel; a through-hole configured to pass through a lower part of the processing vessel; and a rotation shaft configured to pass through the through-hole, and rotate and support the substrate holding unit from a lower part.

(Supplementary Note 10)

In the substrate processing apparatus of Supplementary Note 1, it is preferable that the substrate processing apparatus further comprises: an opening part installed in the first side of the process vessel for unloading the substrate therethrough; and a cover configured to open or close the opening part.

(Supplementary Note 11)

In the substrate processing apparatus of Supplementary Note 1, it is preferable that the gas introduction port and the gas exhaust port are arranged at opposite positions, with the substrate being inserted therebetween, and a portion of the gas flow path defined by the slope part is sloped in a direction different from a direction directed from the gas introduction port to the gas exhaust port such that the gas flow path is longer than a straight distance between the gas introduction port and the gas exhaust port.

(Supplementary Note 12)

In the substrate processing apparatus of Supplementary Note 11, it is preferable that a portion of a wall surface of the slope part in an installation region of the gas introduction port, and a portion of a wall surface of the slope part in an installation region of the gas exhaust port are sloped in a direction different from a direction directed from the gas introduction port to the gas exhaust port, with the substrate being inserted in parallel along a diameter direction.

(Supplementary Note 13)

In the substrate processing apparatus of Supplementary Note 12, it is preferable that the substrate processing apparatus further comprises a carrying device configured to carry the substrate in or out of the process vessel along a gas flow path around a midstream side of the gas guided by the slope part.

(Supplementary Note 14)

In the substrate processing apparatus of Supplementary Note 1, it is preferable that the gas introduction port and the gas exhaust port are arranged at positions facing each other, with the substrate inserted therebetween, and a sidewall of the slope part in an adjacent region of the gas introduction port is parallel to that of the slope part in an adjacent region of the gas exhaust port.

(Supplementary Note 15)

In the substrate processing apparatus of Supplementary Note 1, it is preferable that, in an adjacent region of an upstream side of the gas flow inside the process vessel, a wall surface of the slope part in an installation region of the gas introduction port side is parallel to an inner wall surface of the first side of the process vessel, in an adjacent region of the midstream side of the gas flow inside the process vessel, a wall surface of the slope part in an installation region of the gas introduction port and a wall surface of the slope part in an installation region of the gas exhaust port are sloped in a direction different from a direction directed from the gas introduction port to the gas exhaust port, with the substrate being inserted in parallel along a diameter direction of the substrate, and in an adjacent region of the downstream side of the gas flow inside the process vessel, a wall surface of the slope part in an installation region of the gas exhaust port side is parallel to an inner wall surface of the second side of the process vessel.

(Supplementary Note 16)

In the substrate processing apparatus of Supplementary Note 1, it is preferable that a wall surface of the slope part in an installation region of the gas introduction port in an upstream side of the gas flow inside the process vessel, an inner wall surface of the first side of the process vessel, a wall surface of the slope part in an installation region of the gas exhaust port in a downstream side of the gas flow inside the process vessel, and an inner wall surface of the second side of the process vessel are parallel to one another.

(Supplementary Note 17)

In accordance with another embodiment of the present invention, there is provided a process tube having a cylindrical shape, comprising: a first opening formed at an end portion of the cylindrical shape; a first flange formed at the first opening; and a gas introduction port formed in an adjacent region of the first opening and configured to introduce gas into the process tube, wherein a width of the flange in a region where the gas introduction port is installed is greater than that of the flange opposite to the region where the gas introduction port is formed.

(Supplementary Note 18)

In the process tube of Supplementary Note 17, it is preferable that the process tube further comprises: a second opening formed at an end portion opposite to the first opening; a second flange formed at the second opening; and a gas exhaust port formed around the second opening and configured to exhaust gas out of the process tube, wherein a width of the flange in a region where the gas exhaust port is formed is greater than that of the flange opposite to the region where the gas exhaust port is formed.

(Supplementary Note 19)

In accordance with another embodiment of the present invention, there is provided a method for manufacturing a semiconductor device for processing a substrate by using the substrate processing apparatus of Supplementary Note 1, comprising: introducing gas from a lateral side of a substrate; guiding the gas by the slope part and supplying the gas to the substrate; and exhausting the gas from the lateral side of the substrate by the gas exhaust port.

(Supplementary Note 20)

In accordance with another embodiment of the present invention, there is provided a method for manufacturing a semiconductor device, comprising: loading a substrate into a process vessel and holding the substrate at a horizontal position; introducing gas inside the process vessel from a lateral side of the substrate due to a gas introduction port installed in an adjacent region of the first side of the process vessel; supplying gas to the substrate by guiding the gas along a slope part installed inside the process vessel between the gas introduction port and a gas exhaust port installed in an adjacent region of the second side of the process vessel which is opposite to the first side; exhausting the gas inside the process vessel from the lateral side of the substrate by the gas exhaust port to thereby process the substrate; and unloading the processed substrate from the process vessel.

What is claimed is:

1. A substrate processing apparatus, comprising:
   a process vessel configured to accommodate and process a plurality of substrates stacked vertically, each of the plurality of substrates being held horizontally;
   a gas introduction port installed in a first manifold of the process vessel and configured to introduce a gas into the process vessel from the lateral side of the substrate;
   a gas exhaust port installed in a second manifold of the process vessel opposite to the gas introduction port, and configured to exhaust the gas inside the process vessel from the lateral side of the substrate; and
   a first slope part and a second slope part installed between the first manifold and the second manifold inside the process vessel with the plurality of substrates disposed therebetween, the first slope part sloped in a direction different from that of the gas introduction port and the second slope part sloped in a direction different from that of the gas exhaust port in a manner that a surface of the first slope part and a surface of the second slope part are both perpendicular to a principle surface of any one of the plurality of substrates to define a flow path of the gas in z-shape for guiding the gas to flow parallel to the principle surface of any one of the plurality of substrates.

2. The substrate processing apparatus of claim 1, further comprising:
   a heating device installed in an outer periphery of the process vessel and configured to heat the plurality of substrates accommodated in the process vessel; and
   a preheating device installed at a periphery of the process vessel to surround a first side except a region where the heating device is installed, and configured to preheat the gas introduced into the process vessel.

3. The substrate processing apparatus of claim 1, further comprising:
   a substrate holding unit configured to hold the plurality of substrates;
   a rotation shaft configured to pass through a through-hole disposed at a lower part of the processing vessel, the rotation shaft rotating and supporting the substrate holding unit from the lower part.

4. The substrate processing apparatus of claim 1, further comprising:
   an opening part installed at a first side of the process vessel for unloading the substrate therethrough; and
   a cover configured to open and close the opening part.

5. The substrate processing apparatus of claim 1, wherein the gas flow path defined by the first slope part and the second slope part is longer than a straight distance between the gas introduction port and the gas exhaust port.

6. The substrate processing apparatus of claim 1, wherein the process vessel comprises:
a process tube having a first opening and a second opening at end portions thereof,
wherein the first manifold installed in the first opening of the process tube, and
wherein the second manifold installed in the second opening of the process tube.

7. The substrate processing apparatus of claim 6, wherein the process tube comprises:
a first flange at the first opening; and
a second flange at the second opening.

8. The substrate processing apparatus of claim 7, wherein the first slope part extends from an adjacent region of the gas introduction port to the second flange through a substrate loading region and the second slope part extends from an adjacent region of the gas exhaust port to the first flange the substrate loading region.

9. The substrate processing apparatus of claim 8, wherein the substrate loading region is disposed between the first slope part and the second slope part.

10. The substrate processing apparatus of claim 7, wherein a width of the first flange in a region where the gas introduction port is installed is greater than that of the first flange opposite to the region where the gas introduction port is installed.

11. The substrate processing apparatus of claim 7, wherein the first slope part comprises a first portion and a second portion, the second portion of the first slope part being installed in an upstream region of the gas flow path adjacent to the gas introduction port and the first portion of the first slope part extending from the second portion of the first slope part to the second flange, and the second slope part comprises a first portion and a second portion, the second portion of the second slope part being installed in an downstream region of the gas flow path adjacent to the gas exhaust port and the first portion of the second slope part extending from the second portion of the second slope part to the first flange.

12. The substrate processing apparatus of claim 11, further comprising:
a carrying device configured to carry the substrate in and out of the process vessel around a midstream region of the gas flow path.

13. The substrate processing apparatus of claim 11, wherein the gas introduction port and the gas exhaust port are arranged at positions facing each other, with the substrate disposed therebetween, and the second portion of the first slope part is parallel to that of the second slope part.

14. The substrate processing apparatus of claim 11, wherein the second portion of the first slope part in the upstream region is parallel to an inner wall surface of a first side of the process vessel, and the second portion of the second slope part in the downstream region is parallel to an inner wall surface of a second side of the process vessel.

15. The substrate processing apparatus of claim 11, wherein the second portion of the first slope part, the second portion of the second slope part, an inner wall surface of a first side of the process vessel and an inner wall surface of a second side of the process vessel are parallel to one another.

* * * * *